United States Patent
Jang et al.

(10) Patent No.: US 10,158,261 B2
(45) Date of Patent: Dec. 18, 2018

(54) ELECTRONIC DEVICE HAVING WIRELESS POWER TRANSMITTING/RECEIVING CONDUCTIVE PATTERN

(71) Applicant: Samsung Electronics Co., Ltd, Gyeonggi-do (KR)

(72) Inventors: Kiyoun Jang, Gyeonggi-do (KR); Chulwoo Park, Gyeonggi-do (KR); Hyundeok Seo, Gyeonggi-do (KR); Se-Young Jang, Gyeonggi-do (KR); Chi-Hyun Cho, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 148 days.

(21) Appl. No.: 15/236,374

(22) Filed: Aug. 12, 2016

(65) Prior Publication Data
US 2017/0047791 A1   Feb. 16, 2017

(30) Foreign Application Priority Data

Aug. 12, 2015   (KR) .......................... 10-2015-0114199

(51) Int. Cl.
*H02J 50/90* (2016.01)
*H02J 50/12* (2016.01)
(Continued)

(52) U.S. Cl.
CPC ............. *H02J 50/90* (2016.02); *H01F 38/14* (2013.01); *H02J 7/025* (2013.01); *H02J 50/12* (2016.02); *H04B 5/0031* (2013.01); *H04B 5/0037* (2013.01); *H04B 5/0081* (2013.01); *H05K 1/0203* (2013.01); *H05K 1/181* (2013.01); *G01K 13/00* (2013.01); *H04M 1/0262* (2013.01); *H04M 1/0277* (2013.01); *H04M 2250/12* (2013.01); *H05K 2201/1003* (2013.01);
(Continued)

(58) Field of Classification Search
CPC ....... H02J 7/00; H01F 38/14; H04M 2250/12; H04M 1/0277; H04M 1/0262; G01K 13/00; H05K 1/181; H05K 1/0203; H05K 2201/1003; H05K 2201/10037; H05K 2201/10151; H04B 5/0031; H04B 5/0037; H04B 5/0081
See application file for complete search history.

(56) References Cited

U.S. PATENT DOCUMENTS

| 2003/0068991 | A1 | 4/2003 | Lee |
| 2011/0050164 | A1* | 3/2011 | Partovi ................ H01F 5/003 320/108 |

FOREIGN PATENT DOCUMENTS

KR   10-2003-0029406   4/2003

* cited by examiner

*Primary Examiner* — Robert Deberadinis

(57) ABSTRACT

Various embodiments of the present disclosure may provide an electronic device that includes: a first plate directed in a first direction, a second plate directed in a second direction opposite to the first direction, and a side member configured to surround at least a part of the space between the first and second plates; a first printed circuit board (PCB) that is disposed between the first and second plates and includes at least one processor; a second printed circuit board (PCB) that is disposed between the first printed circuit board and the second plate and includes at least one antenna pattern; and a temperature sensor disposed to measure the temperature of at least a part of the second printed circuit board. Other various embodiments are possible.

17 Claims, 22 Drawing Sheets

(51) Int. Cl.
*H02J 7/02* (2016.01)
*H05K 1/18* (2006.01)
*H05K 1/02* (2006.01)
*H04B 5/00* (2006.01)
*H01F 38/14* (2006.01)
*G01K 13/00* (2006.01)
*H04M 1/02* (2006.01)

(52) U.S. Cl.
CPC .............. *H05K 2201/10037* (2013.01); *H05K 2201/10151* (2013.01)

ELECTRONIC DEVICE HAVING WIRELESS POWER TRANSMITTING/RECEIVING CONDUCTIVE PATTERN

CROSS-REFERENCE TO RELATED APPLICATION(S) AND CLAIM OF PRIORITY

The present application is related to and claims the priority under 35 U.S.C. § 119(a) to Korean Application Serial No. 10-2015-0114199, which was filed in the Korean Intellectual Property Office on Aug. 12, 2015, the entire content of which is hereby incorporated by reference.

TECHNICAL FIELD

Various embodiments of the present disclosure relate to a temperature sensor mounting structure for detecting the temperature of a wireless charging coil.

BACKGROUND

Wireless charging devices (e.g., systems) may convert electrical energy into an electromagnetic wave form of energy to wirelessly transfer the energy as a load without a transmission line.

Wireless charging may be mainly classified into a charging type using electromagnetic induction and a charging type using magnetic resonance. The electromagnetic induction type charging technique is a method of charging a battery while a charging pad and two coils of an electronic device generate an induced current, and the magnetic resonance type charging technique is a method of performing charging by transmitting power to a transmitting/receiving end, which is 1 to 2 meter (m) away, at the same frequency.

The magnetic induction type charging technique, which is one of the wireless charging techniques, is a method of transferring power using a magnetic field induced in a coil, and may supply energy as a load by making an induced current flow in a receiving coil using a magnetic field generated by a current that flows in a transmission coil. There are standards of the magnetic induction type including wireless power consortium (WPC) and power matters alliance (PMA), etc. The WPC may use a power transmission frequency of 110 to 205 kilohertz (kHz), and the PMA may use a power transmission frequency of 227 to 357 kHz or 118 to 153 kHz.

SUMMARY

When an electronic device that supports wireless power transmission/reception transmits and receives power in a wireless manner, the surface temperature of the electronic device may increase, which causes a limitation of usability.

For example, when misalignment occurs between a wireless power transmitting electronic device and a wireless power receiving electronic device, heat energy may be generated due to degradation in power transmission efficiency, which causes an increase in the surface temperature of the wireless power transmitting electronic device or wireless power receiving electronic device.

Although the wireless power transmitting/receiving electronic devices have temperature sensors (thermistors) in order to measure the internal temperature thereof, the temperature sensors may fail to accurately measure the surface temperature of the electronic devices that is generated during wireless power transmission/reception because the temperature sensors are not located close to conductive patterns for the wireless power transmission/reception.

Various embodiments of the present disclosure may provide an electronic device in which a temperature sensor can be mounted without an increase in the thickness of the electronic device.

Further, various embodiments of the present disclosure may provide a method and device that can accurately measure temperature in order to effectively control the heat dissipation of an electronic device during wireless power transmission/reception, thereby effectively controlling the heat dissipation based on the accurate temperature.

Various embodiments of the present disclosure provide an electronic device that includes: a first plate directed in a first direction, a second plate directed in a second direction opposite to the first direction, and a side member configured to surround at least a part of the space between the first and second plates; a first printed circuit board (PCB) that is disposed between the first and second plates and includes at least one processor; a second printed circuit board (PCB) that is disposed between the first printed circuit board and the second plate and includes at least one antenna pattern; and a temperature sensor disposed to measure the temperature of at least a part of the second printed circuit board.

Various embodiments of the present disclosure provide an electronic device that includes: a printed circuit board (PCB); at least one wireless power supply coil mounted on the PCB; at least one temperature sensor disposed around the coil on the PCB; a battery pack disposed to face the coil; and a rear case in which the battery pack is accommodated, and the temperature sensor may be disposed around the coil.

Various embodiments of the present disclosure provide an electronic device that includes: a support structure; a display disposed on a first surface of the support structure; a first PCB disposed on a second surface opposite to the first surface of the support structure; a rear case coupled to the support structure; a battery pack accommodated in the rear case; a front cover disposed on the front of the display; a rear cover disposed on the back of the rear case; a second PCB mounted on the rear cover; a wireless charging antenna provided on the second PCB; and at least one temperature sensor disposed around the antenna of the second PCB.

According to the various embodiments of the present disclosure, a temperature sensor can be mounted in an electronic device without an increase in the thickness of the electronic device.

In addition, the various embodiments of the present disclosure may provide a method capable of accurately measuring the temperature of a wireless power transmitting/receiving conductive pattern using a temperature sensor mounted in an electronic device.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1A:
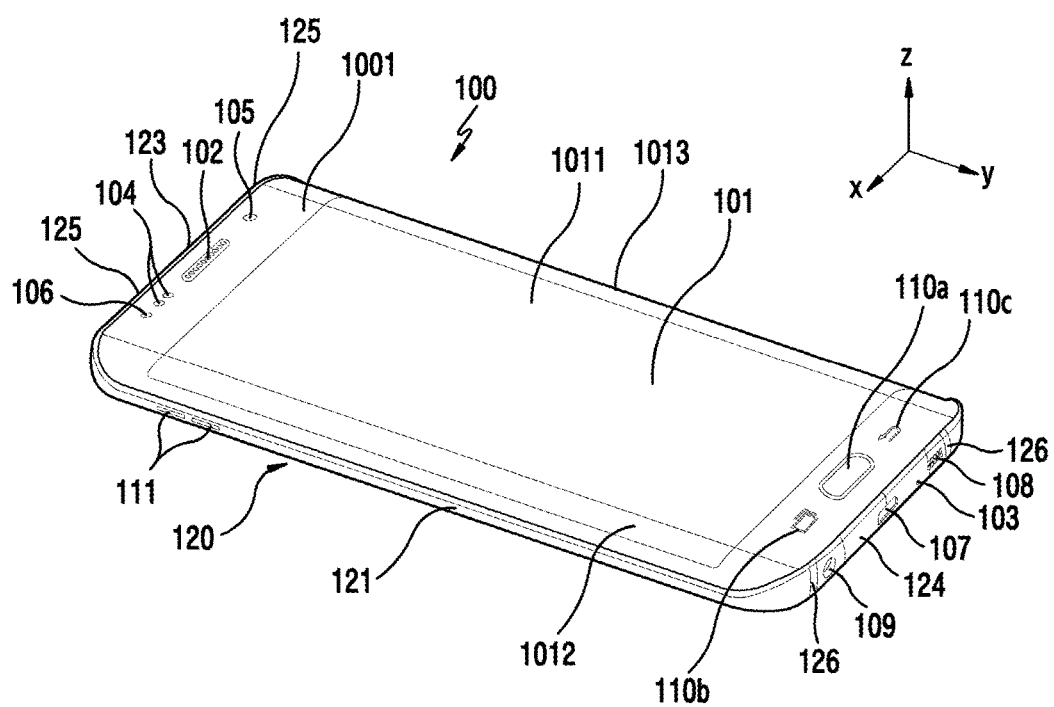
FIG. 1A illustrates a front perspective view of an electronic device according to various embodiments of the present disclosure.

FIGS. 1A through 15, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged electronic devices. The disclosure is described with reference to the accompanying drawings. The disclosure may be changed and may include various examples, and specific examples are exemplarily described and related detailed descriptions are made in the specification. However, it should be understood that the various examples of the disclosure are not limited to a specific embodied form and include all modifications and/or equivalents or substitutions that fall within the spirit and technical scope of the disclosure. In the drawing, like reference numerals are used for like elements.

Expressions such as "include" or "may include", etc. that may be used in the disclosure indicate existence of a disclosed relevant function, operation, or element, etc., and do not limit additional one or more functions, operations, or elements, etc. Also, it should be understood that terminologies such as "include" or "have", etc. in the disclosure are intended for designating existence of a characteristic, a number, a step, an operation, an element, a part, or a combination of these described on the specification and do not exclude in advance existence or addition possibility of one or more other characteristics, numbers, steps, operations, elements, parts, or a combination of these.

Expression such as "or", etc. in the disclosure includes a certain and all combinations of words listed together. For example, "A or B" may include A and may include B, or include both A and B. In the disclosure, expressions such as "1st", "2nd", "first" or "second", etc. may modify various elements of the disclosure but do not limit relevant elements. For example, the expressions do not limit sequence and/or importance, etc. of relevant elements. The expressions may be used for discriminating one element from another element. For example, both a first user apparatus and a second user apparatus are all user apparatuses, and represent different user apparatuses. For example, a first element may be named as a second element without departing from the scope of the disclosure, and similarly, the second element may be named as the first element. When it is mentioned that a certain element is "connected to" or "accesses" another element, it should be understood that the element may be directly connected to another element or may directly access another element, but still another element may exist in the middle. In contrast, when it is mentioned that a certain element is "directly connected to" or "directly accesses" another element, it should be understood that still another element does not exist in the middle. Terminology used in the disclosure is used for explaining only a specific example and is not intended to limit the disclosure. Unless clearly expressed otherwise, expression of the singular includes expression of the plural. Unless defined differently, all terminologies used herein including technological or scientific terminologies have the same meaning as that generally understood by a person of ordinary skill in the art to which the disclosure belongs. It should be understood that generally used terminologies defined by a dictionary have meaning coinciding with meaning on context of a related technology, and unless clearly defined in the disclosure, they are not understood as an ideal or excessively formal meaning.

An electronic device of disclosure may be a device including a communication function. For example, an electronic device may include at least one of a smartphone, a tablet personal computer (PC), a mobile phone, a video phone, an e-book reader, a desktop PC, a laptop PC, a netbook computer, a Personal Digital Assistant (PDA), a Portable Multimedia Player (PMP), an MP3 player, a mobile medical device, a camera, or a wearable device (e.g., a head-mounted-device (HMD) such as electronic glasses, an electronic clothing, an electronic bracelet, an electronic necklace, an electronic appcessory, an electronic tattoo, or a smartwatch).

According to certain examples, an electronic device may be a smart home appliance having a communication function. A smart home appliance may include, for example, at least one of a television, a Digital Video Disk (DVD) player, an audio, a refrigerator, an air conditioner, a cleaner, an oven, an electronic range, a washing machine, an air purifier, a set-top box, a TV box (e.g., Samsung HomeSync™, Apple TV™, or Google TV™), game consoles, an electronic dictionary, an electronic key, a camcorder, or an electronic frame.

According to certain examples, an electronic device may include at least one of various medical devices (e.g., Magnetic Resonance Angiography (MRA), Magnetic Resonance Imaging (MRI), Computed Tomography (CT), a shooting device, an ultrasonic device, etc.), a navigation device, a Global Positioning System (GPS) receiver, an event data recorder (EDR), a flight data recorder (FDR), an automobile information device, electronic equipment for a ship (e.g., a navigation device for a ship, a gyro compass, etc.), an avionics, a security device, or a robot for an industrial use or a home use.

According to certain examples, an electronic device may include at least one of furniture or a portion of a building/structure including a communication function, an electronic board, an electronic signature receiving device, a projector, or various measurement devices (e.g., waterworks, electricity, gas, or radio wave measuring device, etc.). An electronic device according to the disclosure may be a combination of one or more of the above-described devices. Also, it will be apparent to one skilled in the art that the electronic device examples of the disclosure are not limited to the above-described devices.

Figure 1B:
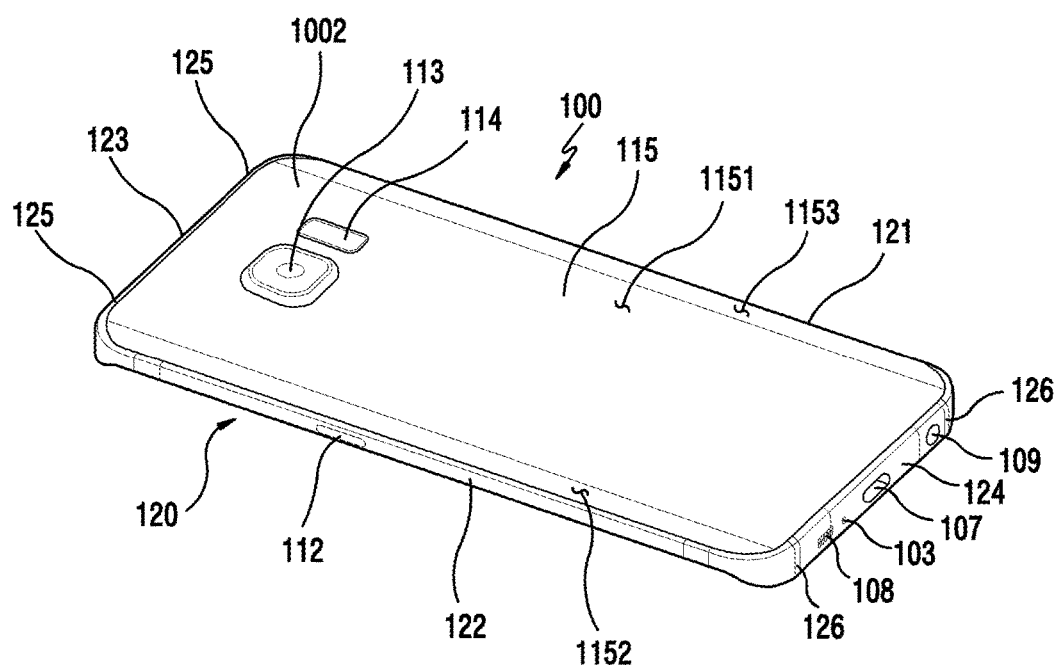
FIG. 1B illustrates a rear perspective view of the electronic device according to the various embodiments of the present disclosure.

An electronic device according to various examples of the disclosure is described with reference to the accompanying drawings. A terminology of a user used in various examples may indicate a person who uses an electronic device or a device (e.g., an artificial intelligence electronic device) that uses the electronic device. FIG. 1A illustrates a front perspective view of an electronic device according to various embodiments. FIG. 1B illustrates a rear perspective view of the electronic device according to the various embodiments.

Figure 1C:
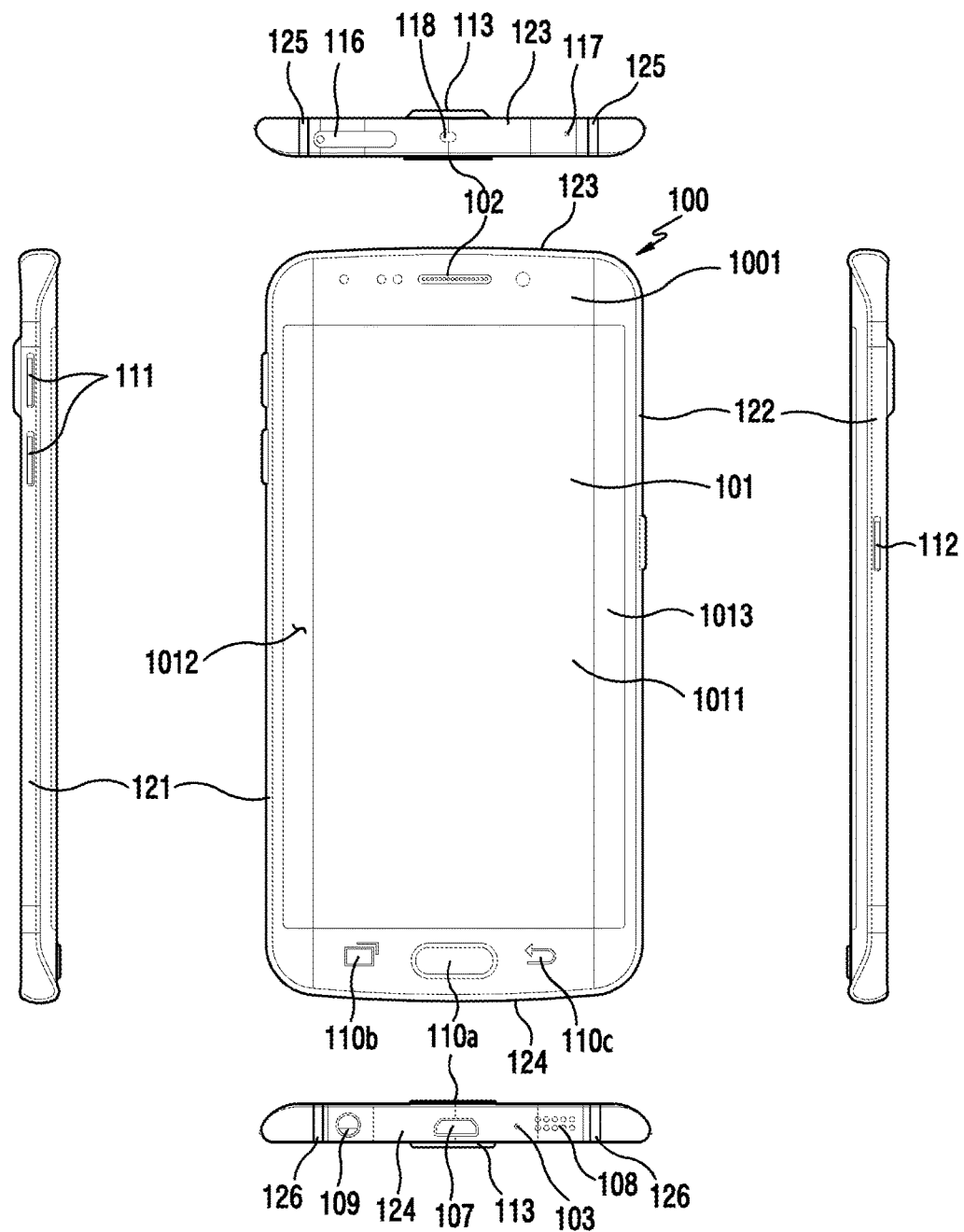
FIG. 1C illustrates views of the electronic device when viewed from the front, top, bottom, left, and right according to the various embodiments of the present disclosure.

FIG. 1C illustrates views of the electronic device, according to the various embodiments, when viewed from the front, top, bottom, left, and right.

Referring to FIGS. 1A to 1C, the electronic device 100, according to the various embodiments, may have a display 101 (or referred to as the touch screen) mounted on the front thereof. A receiver 102 may be disposed on the upper side of the display 101 to receive a counterpart's speech. A microphone 103 may be disposed on the lower side of the display 101 to transmit, to the counterpart, a speech of a user that uses the electronic device.

Components for performing various functions of the electronic device 101 may be disposed around the receiver 102. The components may include at least one sensor 104. The sensor 104 may include, for example, at least one of an illuminance sensor (e.g., an optical sensor), a proximity sensor (e.g., an optical sensor), an infrared sensor, and an ultrasonic sensor. According to an embodiment, the components may include a front camera 105. According to an embodiment, the components may also include an indicator 106 for informing the user of state information of the electronic device 100.

The display 101 may be formed to be large in size in order to cover almost the entire front of the electronic device 100. The main home screen is the first screen that is displayed on the display 101 when the electronic device 100 is turned on. Further, when the electronic device 100 has multiple pages of different home screens, the main home screen may be the first home screen of the multiple pages of home screens. Short-cut icons for executing frequently used applications, a main menu switch key, time, weather, and the like may be displayed on the home screen. The main menu switch key is used to display a menu screen on the display 101. Further, a status bar that indicates the state of the electronic device 100 (such as a battery charging state, the strength of a received signal, and the current time) may be formed on the upper end of the display 101. A home key 110a, a menu key 110b, and a back key 110c may be formed on the lower side of the display 101.

The home key 110a is used to display the main home screen on the display 101. For example, the home screen may be mainly displayed on the display 101 when the home key 110a is touched while a home screen that is different from the main home screen, or the menu screen, is displayed on the display 101. Further, when the home key 110a is touched while applications are being executed on the display 101, the main home screen may be displayed on the display 101. In addition, the home key 110a may also be used to display recently used applications or a task manager on the display 101.

The menu key 110b provides a connectivity menu that may be used on the display 101. The connectivity menu may include a widget addition menu, a background screen switch menu, a search menu, an editing menu, an environment configuration menu, etc. The back key 110c may be used to display the screen that was executed just before the currently executed screen, or to end the most recently used application.

The electronic device 100, according to the various embodiments, may include a metal frame 120 as a metal housing. The metal frame 120 may be disposed along the outer periphery of the electronic device 100, and may extend to at least one area of the back of the electronic device 100, which is connected to the outer periphery of the electronic device. The metal frame 120 may define at least a part of the thickness of the electronic device 100 along the outer periphery of the electronic device 100, and may be formed in a closed loop shape. Without being limited thereto, however, the metal frame 120 may be formed such that it contributes to at least a part of the thickness of the electronic device 100.

The metal frame 120 may also be disposed only in at least one area of the outer periphery of the electronic device 100. In a case where the metal frame 120 serves as a part of the housing of the electronic device 100, the rest of the housing may be replaced with a non-metal member. In this case, the housing may be formed in such a manner that the non-metal member is insert-molded into the metal frame 120. The metal frame 120 may include one or more cut-off portions 125 and 126, and unit metal frames separated by the cut-off portions 125 and 126 may be used as antenna coils. An upper frame 123 may serve as a unit frame by a pair of cut-off portions 125 that are formed with a predetermined interval therebetween. A lower frame 124 may serve as a unit frame by a pair of cut-off portions 126 that are formed with a predetermined interval therebetween. The cut-off portions 125 and 126 may be formed together when the non-metal member is insert-molded into the metal member.

The metal frame 120 may have a closed loop shape along the outer periphery of the electronic device, and may be disposed in such a manner that the metal frame 120 contributes to the whole thickness of the electronic device 100. When the electronic device 100 is viewed from the front, the metal frame 120 may include a left frame 121, a right frame 122, the upper frame 123, and the lower frame 124.

Various electronic components may be disposed in the lower frame 124 of the electronic device. A speaker 108 may be disposed on one side of the microphone 103. An interface connector 107 may be disposed on the opposite side of the microphone 103 to perform data transmission/reception with an external device and to receive external power in order to charge the electronic device 100. An ear-jack hole 109 may be disposed on one side of the interface connector 107. The microphone 103, the speaker 108, the interface connector 107, and the ear-jack hole 109 may all be disposed within the area of the unit frame that is formed by the pair of cut-off portions 126 disposed in the lower frame 124. Without being limited thereto, however, at least one of the aforementioned electronic components may be disposed in the area that includes the cut-off portion 126, or may be disposed outside the unit frame.

Various electronic components may also be disposed on the upper frame 123 of the electronic device 100. A socket device 116, into which a card-type external device is inserted, may be disposed in the upper frame 123. The socket device 116 may receive at least one of a unique ID card (e.g., a SIM card, a UIM card, etc.) for the electronic device 100 and a memory card for increasing a storage space. An infrared sensor 118 may be disposed on a side of the socket device 116, and an auxiliary microphone device 117 may be disposed on a side of the infrared sensor 118. The socket device 116, the infrared sensor 118, and the auxiliary microphone device 117 may all be disposed within the area of the unit frame that is formed by the pair of cut-off portions 125 disposed in the upper frame 123. Without being limited thereto, however, at least one of the aforementioned electronic components may be disposed within the area that includes the cut-off portion 125, or may be disposed outside the cut-off portions.

At least one first side key button 111 may be disposed in the left frame 121 of the metal frame 120. A pair of first side key buttons 111 may protrude from the left frame 121 and may serve to perform a volume up/down function, a scroll function, etc. At least one second side key button 112 may be disposed in the right frame 122 of the metal frame 120. The second side key button 112 may serve to perform a power on/off function, a wake-up/sleep function of the electronic device, etc. At least one key button 110 may be disposed in at least one area on the lower side of the display 101 on the front 1001 of the electronic device 100. The key button 110 may perform a home key button function. A finger scan sensor device may be disposed on the top of the home key button. The home key button may serve to perform a first function (a home screen return function, a wake-up/sleep function, etc.) by an operation of physically pressing the home key button and to perform a second function (e.g., a finger scan function) by an operation of swiping the top of the home key button. Although not illustrated, touch pads may be disposed on the left and right sides of the key button 110 to perform a touch function.

A rear camera 113 may be disposed on the back 1002 of the electronic device 100, and at least one electronic component 114 may be disposed on a side of the rear camera 113. The electronic component 114 may include at least one of an illuminance sensor (e.g., an optical sensor), a proximity sensor (e.g., an optical sensor), an infrared sensor, an ultrasonic sensor, a heart-rate sensor, and a flash device.

The front 1001 of the electronic device 100, on which the display 101 is mounted, may include a flat surface portion 1011 and left and right curved surface portions 1012 and 1013 that are formed on the left and right sides of the flat surface portion 1011. The front 1001 of the electronic device 100 may include both the display area 101 and the remaining area (e.g., BM area) using a single window. The left and right curved surface portions 1012 and 1013 may extend from the flat surface portion 1011 in the X-axis direction of the electronic device 100. The left and right curved surface portions 1012 and 1013 may serve as a part of the lateral side of the electronic device 100. In this case, the left and right curved surface portions 1012 and 1013 and the left and right frames 121 and 122 of the metal frame 120 may serve as the lateral side of the electronic device 100 together. Without being limited thereto, however, the front 1001 of the electronic device 100, on which the display 101 is mounted, may include only at least one of the left and right curved surface portions 1012 and 1013. The front 1001 of the electronic device 100 may also be configured to include only the left curved surface portion 1012 along the flat surface portion 1011, or to include only the right curved surface portion 1013 along the flat surface portion 1011.

The front 1001 of the electronic device 100 may include: a window (130, illustrated in FIG. 3) that includes the curved surface portions 1012 and 1013 on the left and right sides thereof; and a flexible display that is applied to at least one area on the lower side of the window. The area that includes the flexible display may serve as the display 101. According to an embodiment, the window (130, illustrated in FIG. 3) may be formed in such a manner (hereinafter, referred to as the '3D type') that the top and bottom thereof are simultaneously bent. Without being limited thereto, however, the window (130, illustrated in FIG. 3) may also be formed in such a manner (hereinafter, referred to as the '2.5D type') that the left and right portions of the top thereof are formed in a curved shape and the back thereof is formed in a flat shape. The window may be formed of a transparent glass (e.g., sapphire glass) or a transparent synthetic resin.

The electronic device 100 may control the display to selectively display information. The electronic device 100 may control the display to configure a screen only on the flat surface portion 1011. The electronic device 100 may control the display to configure a screen on the flat surface portion 1011 and one of the left and right curved surface portions 1012 and 1013. The electronic device 100 may control the display to configure a screen only on at least one of the left and right curved surface portions 1012 and 1013, except the flat surface portion 1011.

The back 1002 of the electronic device 100 may also be formed by a single rear external surface mounting member 115 on the whole. The back 1002 of the electronic device 100 may include a flat surface portion 1151 that is formed around the center thereof on the whole and left and right curved surface portions 1152 and 1153 that are formed on the left and right sides of the flat surface portion 1151, respectively. The window 115 may be configured in a 2.5D type such that the left and right curved surface portions 1152 and 1153 of the outer surface are formed in a curved shape and the back thereof is formed in a flat shape. Without being limited thereto, however, the window 115 may also be formed in the 3D type similar to the window disposed on the front 1001 of the electronic device 100. The left and right curved surface portions 1152 and 1153 may serve as a part of the lateral side of the electronic device 100. In this case, the left and right curved surface portions 1152 and 1153 and the left and right frames 121 and 122 of the metal frame 120 may serve as the lateral side of the electronic device 100 together. Without being limited thereto, however, the back 1002 of the electronic device 100 may include only at least one of the left and right curved surface portions 1152 and 1153. The back 1002 of the electronic device 100 may also be configured to include only the left curved surface portion 1152 along the flat surface portion 1151, or to include only the right curved surface portion 1153 along the flat surface portion 1151.

The upper left and right corner portions and the lower left and right corner portions of the front 1001 of the electronic device 100 may be formed such that the upper left and right corner portions and the lower left and right corner portions are simultaneously inclined in the X-axis, Y-axis, and Z-axis directions while the window is being bent. By virtue of this shape, the upper left and right corner portions and the lower left and right corner portions of the metal frame 120 may be formed such that the heights thereof gradually decrease.

Figure 2:
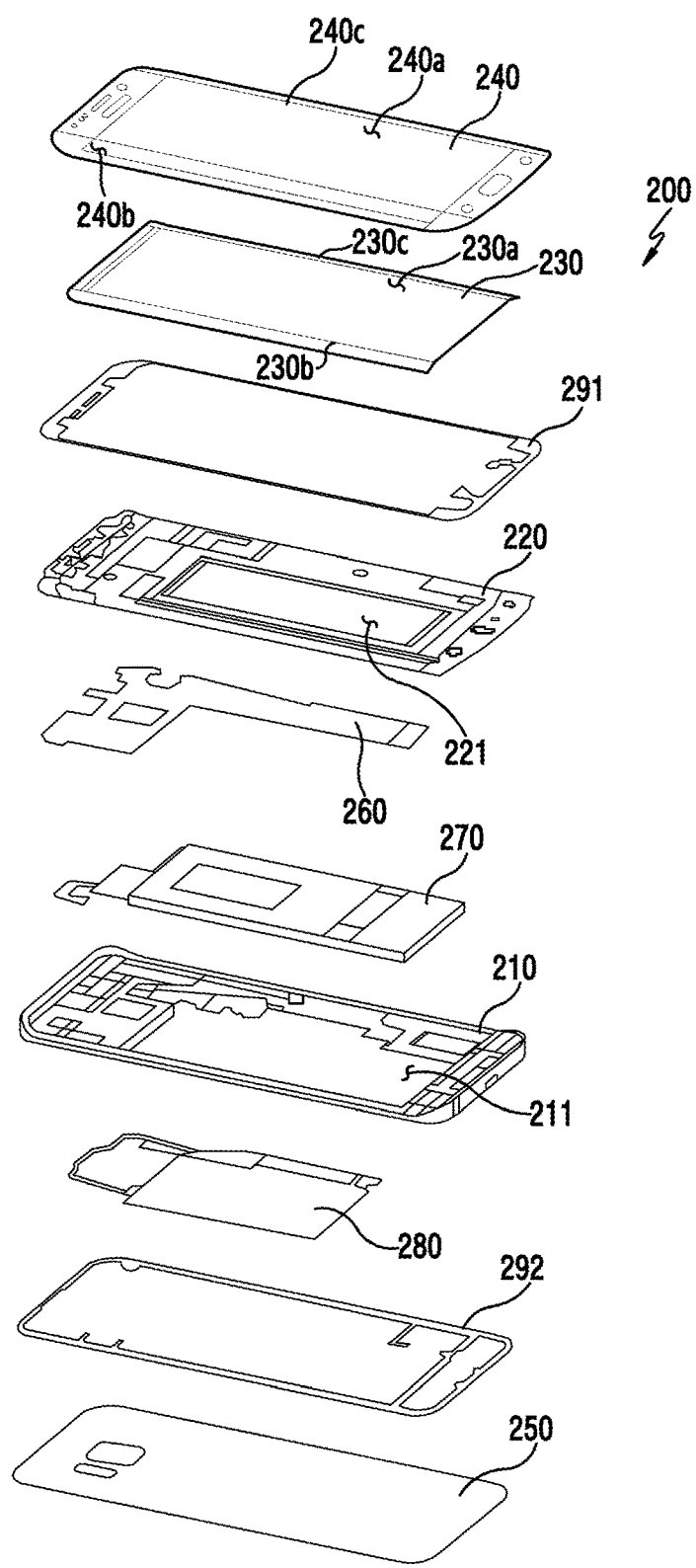
FIG. 2 illustrates an exploded perspective view of a configuration of an electronic device according to various embodiments of the present disclosure.

FIG. 2 illustrates an exploded perspective view of an electronic device according to various embodiments of the present disclosure. Hereinafter, the electronic device 200 in the drawing may be the same electronic device as the above-described electronic device 100.

Referring to FIG. 2, the electronic device 200 may be configured such that a PCB 260, a bracket 220, a display 230, and a front window 240 (referred to as the first plate that is approximately directed in a first direction) are sequentially stacked above the housing 210. According to an embodiment, a wireless power transmitting/receiving member 280 (may include a flexible printed circuit board having an antenna pattern provided thereon) and a rear window 250 (referred to as the second plate that is approximately directed in a second direction opposite to the first direction) are sequentially stacked below the housing 210. According to an embodiment, a battery pack 270 may be accommodated in a battery pack receiving space 211 formed in the housing 210 and may be disposed so as to not overlap the PCB 260. According to an embodiment, the battery pack 270 and the PCB 260 may be disposed in parallel so as to not overlap each other. According to an embodiment, the display 230 may be secured to the bracket 220, and the front window 240 may be secured in such a manner that the front window 240 is attached to the bracket 220 by a first adhesive member 291. According to an embodiment, the rear window 250 may be secured in such a manner that the rear window 250 is attached to the housing 210 by a second adhesive member 292. The electronic device, according to the various embodiments, may include a side member that surrounds at least a part of the space between the first plate and the second plate.

According to various embodiments, the front window 240 may include a flat surface portion 240a and left and right bent portions 240b and 240c that are bent from the flat surface portion 240a in opposite directions. According to an embodiment, the front window 240 is positioned on the top of the electronic device 200 to form the front of the electronic device 200, and is formed of a transparent material to display a screen presented by the display 230 and to provide an input/output window for various sensors. According to an embodiment, while a shape in which the left and right bent portions 240b and 240c are formed in a 3D type is illustrated, a shape may be applied in which the upper and lower portions, as well as the left and right portions, are single-bent, or a shape in which the upper, lower, left, and right portions are dual-bent. According to an embodiment, a touch panel may be further disposed on the back of the front window 240 and may receive a touch input signal from the outside.

According to various embodiments, the display 230 may also be formed in a shape corresponding to that of the front window 240 (a shape having a curvature corresponding to that of the front window 240). According to an embodiment, the display 230 may include the left and right bent portions 230b and 230c on the left and right sides of the flat surface portion 230a. According to an embodiment, a flexible display may be used as the display 230. According to an embodiment, in a case where the front window 240 has the back in the shape of a window of a planar type (hereinafter, 2D type or 2.5D type), a general Liquid crystal display (LCD) or an on-cell tsp AMOLED (OCTA) may be applied since the back of the front window 240 is planar.

According to various embodiments, the first adhesive member 291 is a component for securing the front window 240 to the bracket 220 that is disposed within the electronic device, and may be a kind of tape, such as a double-sided tape, or a liquid adhesive layer, such as a bond. According to an embodiment, in a case where a double-sided tape is applied as the first adhesive member 291, a general poly ethylene terephthalate (PET) or a functional base may be applied as the internal base of the first adhesive member 291. For example, by using a base formed of a foam tape or shock-resistive fabric material so as to reinforce the shock resistance, it is possible to prevent the front window from being damaged by external impact.

According to various embodiments, the bracket 220 may be disposed within the electronic device 200 so as to be used as a component for increasing the rigidity of the whole electronic device. According to an embodiment, the bracket 220 may be formed of at least one metal selected from aluminum (Al), magnesium (Mg), and stainless steel (STS). According to an embodiment, the bracket 220 may be formed of a highly rigid plastic, in which glass fibers are contained, or may be formed of a combination of a metal and a plastic. According to an embodiment, in a case where a metal member and a non-metal member are used together, the bracket 220 may be formed by insert-molding the non-metal member into the metal member. According to an embodiment, the bracket 220 is placed on the back of the display 230. The bracket 220 may have a shape (curvature) that is similar to the shape of the back of the display 230 and may support the display 230. According to an embodiment, an elastic member (such as a sponge or a rubber), an adhesive layer (such as a double-sided tape), or a kind of sheet (such as a single-sided tape) may be additionally disposed between the bracket 220 and the display 230 so as to protect the display 230. According to an embodiment, a section of the bracket 220 may further include a spot-facing or hole area 221 for ensuring a component mounting space or a marginal space in consideration of a change of a component during use, such as the swelling of the battery pack 270. According to an embodiment, as needed, a sheet-type metal or composite material may be added to the corresponding hole area 221 so as to reinforce the internal rigidity, or an auxiliary device for improving a thermal characteristic, an antenna characteristic, or the like may be further provided in the hole area 221. According to an embodiment, the bracket 220 may be fastened to the housing (e.g., the rear case) 210 so as to form a space therein, and at least one electronic component may be disposed in the space. The electronic component may include a Printed Circuit Board (PCB) 260. Without being limited thereto, however, the electronic component may include an antenna device, a sound device, a power supply device, a sensor device, or the like in addition to the PCB 260.

According to various embodiments, the battery pack 270 may supply power to the electronic device 200. According to an embodiment, one surface of the battery pack 270 may be adjacent to the display 230, and the opposite surface thereof may be adjacent to the rear window 250, which may cause the deformation and damage of the counterpart objects when the battery pack 270 expands while being recharged. In order to prevent this, a space (swelling gap) may be provided between the battery pack 270 and the counterpart objects (e.g., the display 230 and the rear window 250) so as to protect the counterpart objects. According to an embodiment, the battery pack 270 may be disposed in a form of being integrated with the electronic device 200. Without being limited thereto, however, the battery pack 270 may be implemented to be detachable when the rear window 250 is implemented to be detachable in the electronic device 200.

According to various embodiments, the housing 210 may form the exterior (e.g., the lateral side that includes a metal bezel) of the electronic device 200 and may be coupled with the bracket 220 to form an internal space. According to an embodiment, the front window 240 may be disposed on the front of the housing 210, and the rear window 250 may be disposed on the back of the housing 210. Without being limited thereto, however, the back of the housing 210 may be implemented with various materials, such as a synthetic resin, a metal, a composite material of a metal and a synthetic resin, etc. According to an embodiment, the gap between the internal structures, which is formed by the housing 210 and the rear window 250, may prevent the rear window 250 from being damaged by a secondary hit of the internal structures when an external shock (such as a fall of the electronic device) occurs.

According to various embodiments, the wireless power transmitting/receiving member 280 may be disposed on the back of the housing 210. According to an embodiment, the wireless power transmitting/receiving member 280 mainly has a thin film shape and is attached to one surface of an internally mounted component or one area of the inner surface of the housing 210; in particular, to an area that is adjacent to the rear window 250. The wireless power transmitting/receiving member 280 includes a structure that forms a contact point with the PCB 260 within the housing 210. According to an embodiment, the wireless power transmitting/receiving member 280 may be embedded or attached as a component of the battery pack 270 or the like, or a part of the housing 210, and may be provided in the form of being attached to both of the component and the housing 210.

According to various embodiments, the second adhesive member 292 is a component for securing the rear window 250 to the housing 210, and may be applied in a shape similar to that of the above-described first adhesive member 291.

According to various embodiments, the rear window 250 may be applied in a shape similar to that of the above-described front window 240. According to an embodiment, the front (the side exposed to the outside) of the rear window 250 may be formed to have a gradually increasing curvature toward the opposite left and right ends thereof. According to an embodiment, the back of the rear window 250 may be formed in a flat surface so as to be attached to the housing 210 by the second adhesive member 292.

Figure 3A:
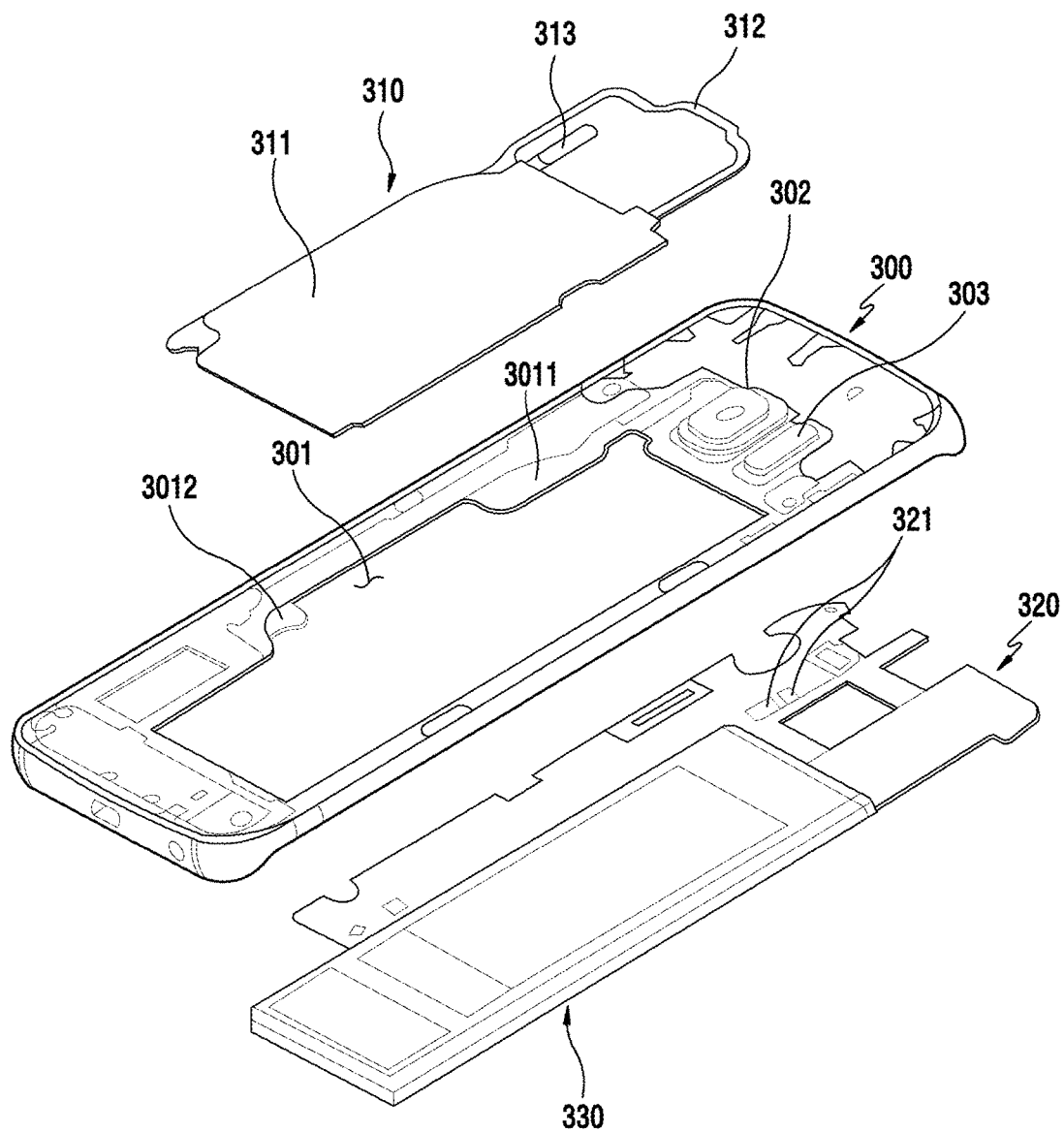
FIG. 3A illustrates an exploded perspective view of a state in which a wireless power transmitting/receiving member is applied to an electronic device according to various embodiments of the present disclosure.
Figure 3B:
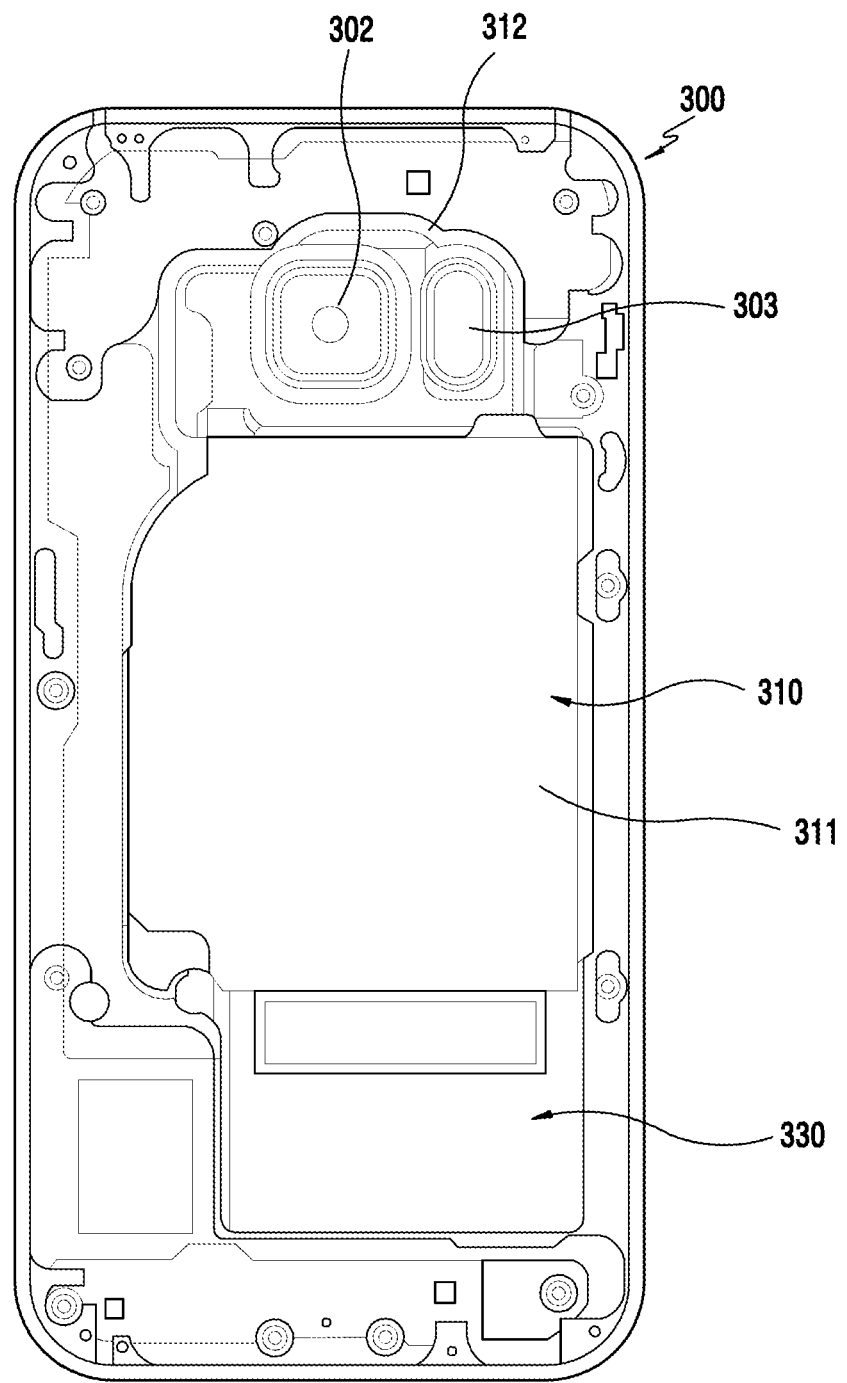
FIG. 3B illustrates a configuration of a housing to which the wireless power transmitting/receiving member is applied according to various embodiments of the present disclosure.
Figure 3C:
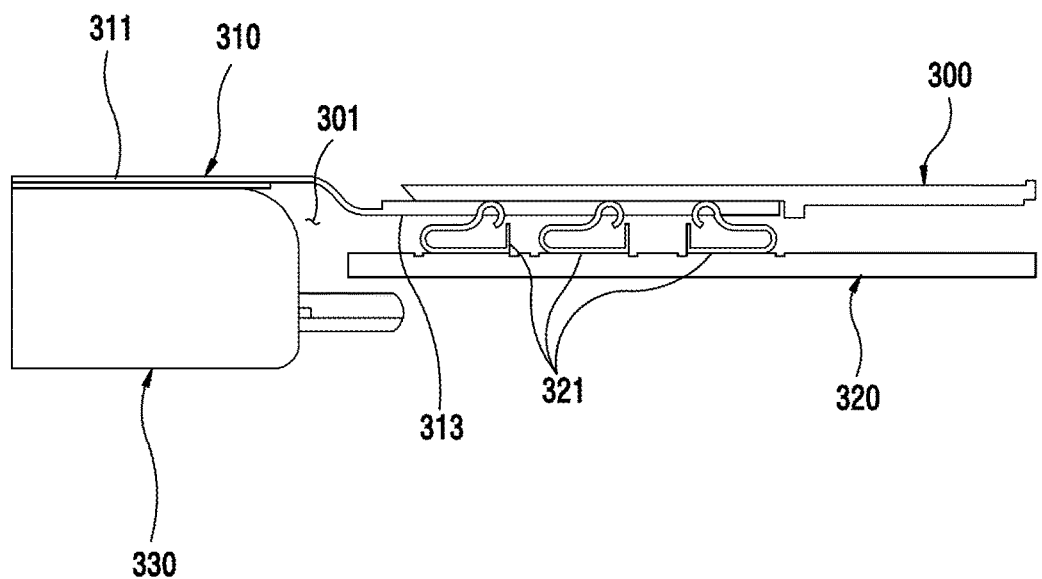
FIG. 3C illustrates a sectional view of major parts of a state in which the wireless power transmitting/receiving member is electrically connected to a printed circuit board (PCB) according to various embodiments of the present disclosure.

FIG. 3A illustrates an exploded perspective view of a state in which an antenna is applied to an electronic device according to various embodiments of the present disclosure. FIG. 3B illustrates a view of a configuration of a housing 300 (used interchangeably with a rear case) to which the antenna is applied, according to various embodiments of the present disclosure. FIG. 3C illustrates a sectional view of major parts of a state in which the antenna is electrically connected to a PCB according to various embodiments of the present disclosure.

Referring to FIGS. 3A to 3C, a wireless power transmitting/receiving member 310 may be disposed to face a rear window over a partial area of the housing 300 and a battery pack 330 (corresponding to 270 of FIG. 2). According to an embodiment, the wireless power transmitting/receiving member 310 may be a communication interface, such as a wireless charging interface, a near field communication (NFC) or magnetic secure transfer (MST) antenna, etc.

According to various embodiments, the housing 300 may have an opening 301 in which the battery pack 330 is accommodated, and one or more flanges 3011 and 3012 may protrude along the outer periphery of the opening 301 in the direction of the opening 301. According to an embodiment, the wireless power transmitting/receiving member 310 may be attached to the flanges 3011 and 3012 and one surface of the battery pack 330.

According to various embodiments, the wireless power transmitting/receiving member 310 may be formed in the shape of a thin film, and may include a plurality of antenna coils. According to an embodiment, the plurality of antenna coils may be wound on the film in various ways (e.g., a spiral type) according to the characteristic of the corresponding communication interface. According to an embodiment, the plurality of antenna coils may be disposed parallel to each other on the same plane of a single film.

According to various embodiments, the wireless power transmitting/receiving member 310 may include a body portion 311 that is disposed on the flanges 3011 and 3012 of the opening 301 and one surface of the battery pack 330, a tail portion 312 withdrawn from the body portion 311, and a contact portion 313 withdrawn from the body portion 311. According to an embodiment, the contact portion 313 may be disposed to correspond to a plurality of contact terminals 321 mounted on a PCB 320. According to an embodiment, when the body portion 311 corresponds to the front of the housing 300, or is disposed on the front of the housing 300, the contact portion 313 may be disposed on the back of the housing 300 so as to be brought into physical or electrical contact with the contact terminals 321 of the PCB 320 below the housing 300.

According to various embodiments, a plurality of electronic components 302 and 303 may be mounted on the housing 300, and the tail portion 312 may be disposed to receive the electronic components 302 and 303. According to an embodiment, the tail portion 312 may include an internal space, and the wireless power transmitting/receiving member 311 may be disposed in such a manner that the electronic components 302 and 303 are disposed in the internal space. According to an embodiment, the electronic components may include the above-described rear camera 302, various types of sensors, and a flash device 303.

Figure 4:
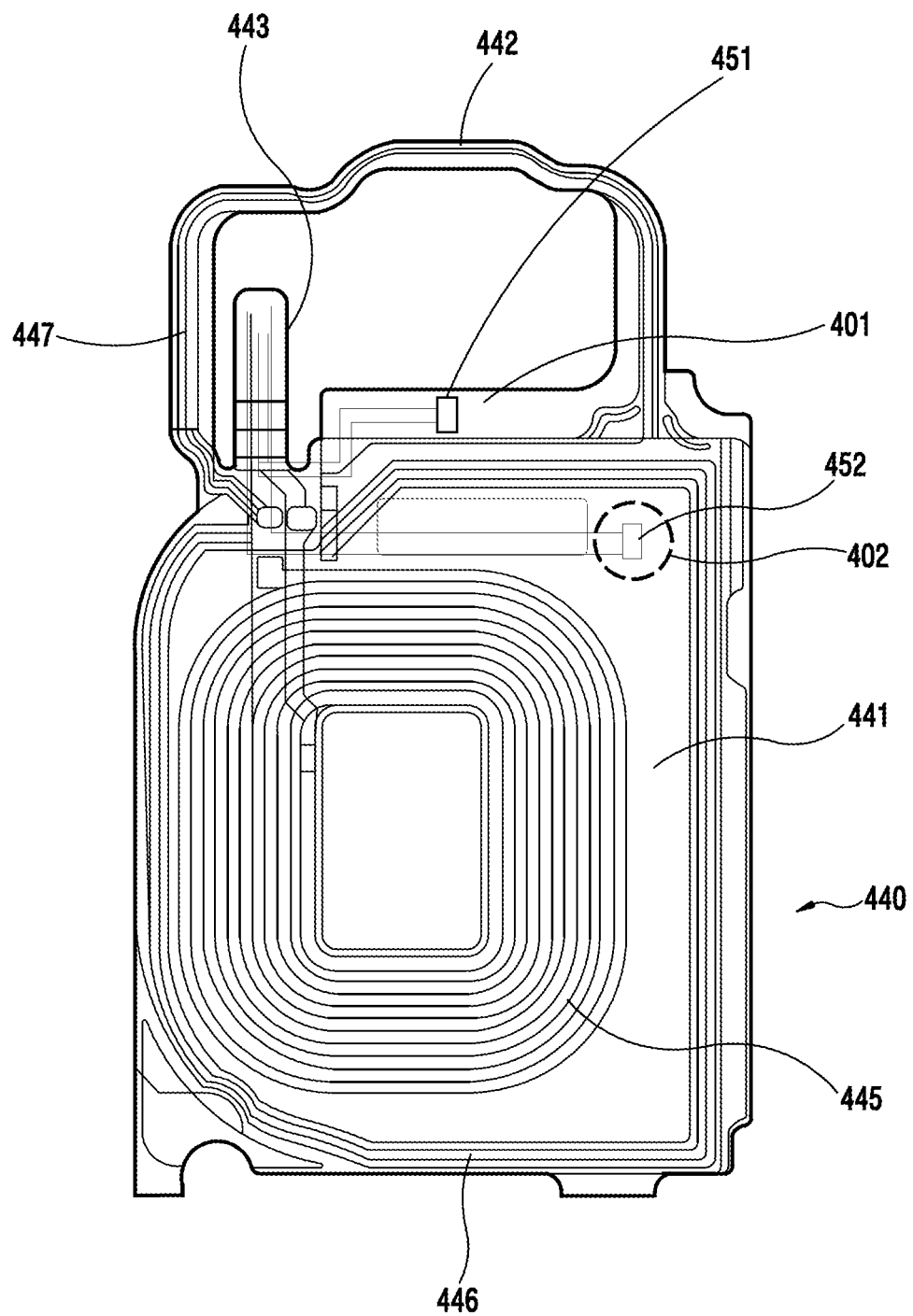
FIG. 4 illustrates a view of a state in which coils and temperature sensors of an antenna are arranged according to various embodiments of the present disclosure.

FIG. 4 illustrates a view of a configuration of an antenna of an electronic device according to various embodiments of the present disclosure.

Referring to FIG. 4, a wireless power transmitting/receiving member 440 (hereinafter, referred to as the antenna) may include a body portion 441 that is applied to an opening of a housing (rear case), a tail portion 442 that is withdrawn from the body portion 441 to have a predetermined internal space, and a contact portion 443 that is withdrawn from the body portion 441 to electrically and physically, or electrically, contact a contact terminal of a PCB.

According to various embodiments, the antenna 440 may be formed in a film type and may have a plurality of antenna coils that are disposed on the same plane so as to be spaced apart from each other and are connected to the contact portion 443. According to an embodiment, a wireless charging antenna coil (circuit) 445 for wireless charging (WPC) (hereinafter, referred to as the first coil) may be spirally disposed around the center of the body portion 441. According to an embodiment, an antenna coil (circuit) 446 for Magnetic Secure Transfer (MST) (hereinafter, referred to as the second coil) may be spirally disposed on the body portion 441 to surround the first coil 445. According to an embodiment, an antenna coil (circuit) 447 for Near Field Communication (NFC) (hereinafter, referred to as the third coil) may be spirally disposed along the tail portion 442. According to an embodiment, the first to third coils 445, 446, and 447 may be disposed on the same plane of the film so as to be spaced apart from each other.

In the arrangement of the first to third coils 445, 446, and 447, the first coil 445 may be disposed in the substantially central area, the second coil 446 may be disposed to surround the first coil 445, and the third coil 447 may be disposed beside the first and second coils 445 and 446.

The antenna 440, according to the various embodiments, may have one or more temperature sensors 451 and 452 disposed thereon for identifying a degree to which heat is generated therefrom. Although it is desirable to measure the temperatures of all the first to third coils 445, 446, and 447, the second and third coils 446 and 447 are not heated at all because the operating time thereof is very short. However, since the first coil 445 is frequently over-heated due to a long charging time, it is necessary to accurately measure the temperature of the heated first coil 445.

One or more temperature sensors 451 and 452, according to the various embodiments, may be disposed on the antenna 440 so as to not cause serious damage to the RF performance of the first to third coils 445, 446, and 447.

In FIG. 4, the temperature sensors, according to the various embodiments, are illustrated as being disposed in the first and second positions 401 and 402. The temperature sensors may be disposed in the first and second positions 401 and 402. The temperature sensor 451 may be disposed in the first position 401, namely, around the first coil 445 or around the second coil 446. Further, the temperature sensor 451 may be disposed on the PCB in the empty space inside the third coil 447. The temperature sensor 451 may be preferably disposed in the first position 401 in consideration of the mounting space of the temperature sensor 451.

Figure 5:
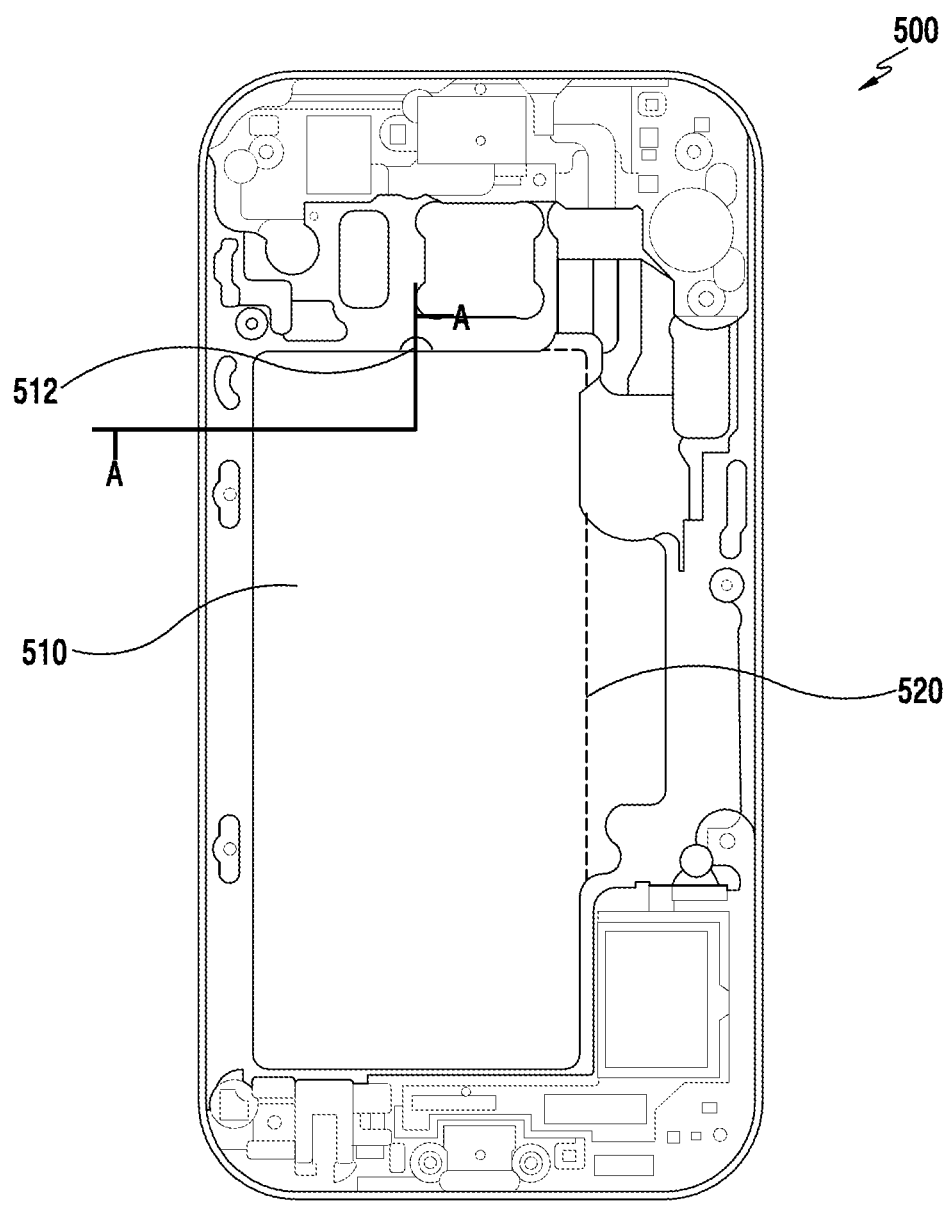
FIG. 5 illustrates a view of a rear case according to various embodiments of the present disclosure.

FIG. 5 illustrates a view of a rear case according to various embodiments of the present disclosure.

Referring to FIG. 5, the rear case 500, according to the various embodiments, may have a first opening 510 in which a battery pack 520 is accommodated parallel thereto without overlap. The first opening 510 may have an area sufficient to accommodate the battery pack 520 parallel thereto. The rear case 500, according to the various embodiments, may have a second opening 512 for accommodating a chip-type (protrusion-type) temperature sensor mounted on a PCB. The second opening 512 may be formed in a shape sufficient to accommodate the temperature sensor, which may be, for example, in a semi-cylindrical shape or a semi-cylindrical recess shape.

The second opening 512 may be disposed in a portion of the area around the first opening 510. In other words, the second opening 512 may be disposed in a portion of the area around the battery pack 520 mounted in the first opening 510. When the battery pack 520 is mounted in the first opening 510, the side of the mounted battery pack 520 may face the second opening 512.

Figure 6A:
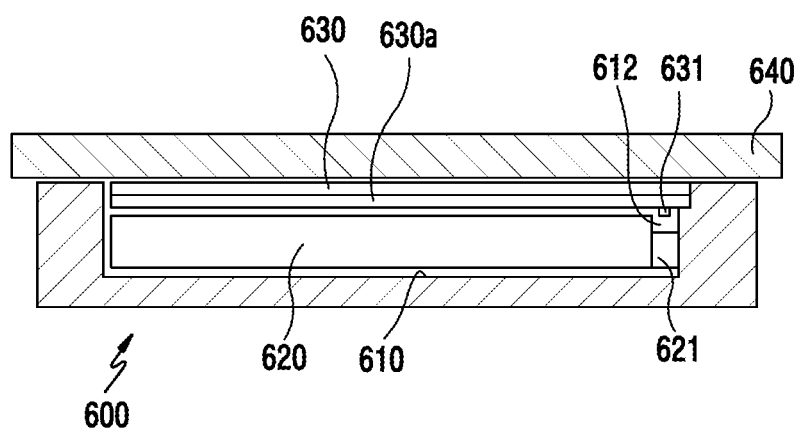
FIG. 6A illustrates a sectional view of a state in which a coil and a temperature sensor of an antenna and a battery pack are arranged according to various embodiments of the present disclosure.
Figure 6B:
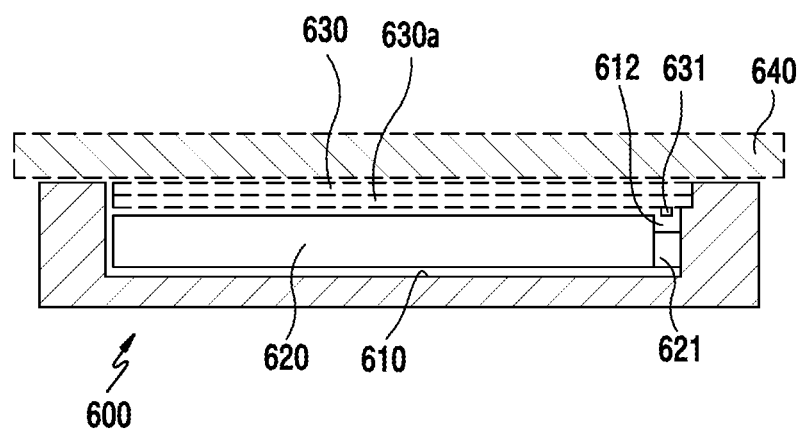
FIG. 6B illustrates a section view taken along line A-A according to various embodiments of the present disclosure.

FIG. 6A illustrates a sectional view of a state in which a coil and a temperature sensor of an antenna and a battery pack are arranged according to various embodiments of the present disclosure. FIG. 6B illustrates a section view taken along line A-A According to various embodiments of the present disclosure.

Referring to FIGS. 6A and 6B, when an electronic device, according to various embodiments, is assembled, the battery pack 620 may be placed in a first opening 610 formed in a rear case 600, the antenna 630 may be disposed above the battery pack 620 to face the same, and a rear cover 640 on which the antenna 630 is mounted may be disposed on the outermost side of the rear case 600.

One of the lateral sides of the battery pack 620 may face a second opening 612 and may be adjacent thereto. The well-know battery pack 620 may include a plurality of battery cells (not illustrated) and a protection circuit module (PCM) 621. The PCM 621, which is a supporter that is formed of a synthetic resin and has a battery protection circuit (not illustrated) and a plurality of charging terminals (not illustrated) therein, may be provided on a side of the battery pack 620. When the battery pack 620 is accommodated in the first opening 610, the PCM (supporter) 621 for the battery pack may be most adjacent to the second opening 612 and may face the same. According to an embodiment, a temperature sensor 631 may be accommodated in the second opening 612. In a case where the temperature sensor 631 is mounted in a chip type on a PCB, a space for accommodating the temperature sensor 631 is required because the temperature sensor 631 has a slightly protruding shape, and the temperature sensor 631 may be accommodated in the second opening 612. If the second opening 612 does not exist, the temperature sensor 631 is disposed to overlap the rear case 600 so that the temperature sensor may be pressed or damaged and may thus be likely to malfunction. According to various embodiments, the temperature sensor 631 may be configured to be mounted on the PCM 621. If there is no interference with the temperature sensor 631 since the first opening 610 of the rear case 600 is sufficiently large, the temperature sensor 631 may be located on the surface corresponding to the circuit of the battery PCM 621 without the second opening 612. Reference numeral 630a indicates a shield material for shielding heat transfer.

Figure 7:
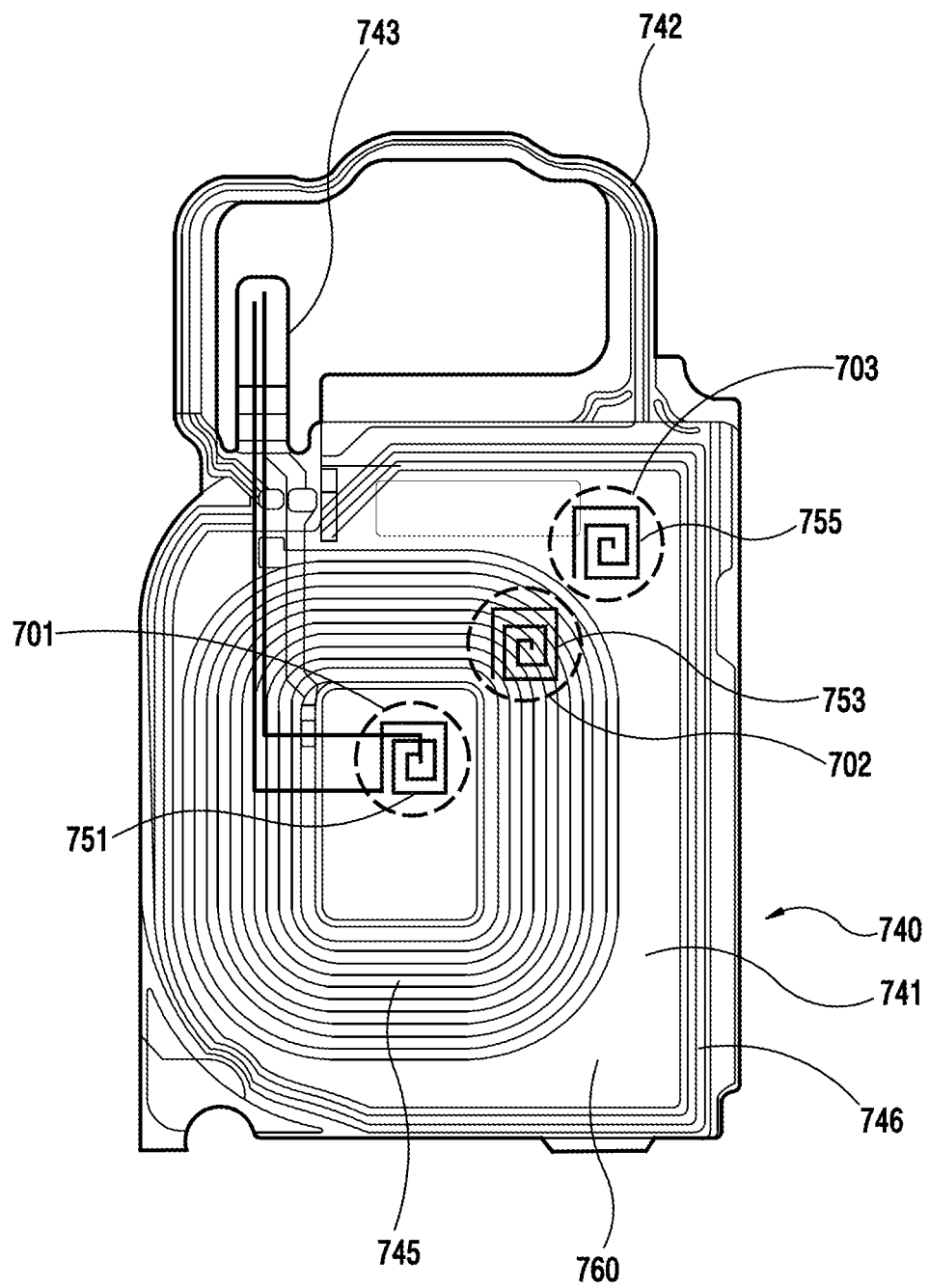
FIG. 7 illustrates a view of a state in which coils and temperature sensors of an antenna are arranged according to various embodiments of the present disclosure.
Figure 8D:
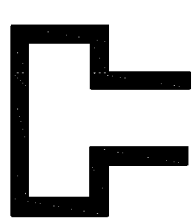
FIGS. 8A to 8D illustrate a view of various patterns of temperature sensors according to various embodiments of the present disclosure.
Figure 8C:
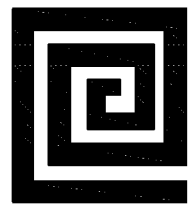
Figure 8B:
Figure 8A:

FIG. 7 illustrates a view of a configuration of an antenna according to various embodiments of the present disclosure.

Referring to FIG. 7, the antenna 740, according to the various embodiments, may include a body portion 741 that is applied to an opening of a rear case, a tail portion 742 that is withdrawn from the body portion 741 to have a predetermined internal space, and a contact portion 743 that is withdrawn from the body portion 741 to make electrical or physical contact with a contact terminal of a PCB 760.

In FIG. 7, temperature sensors, according to various embodiments, are illustrated as being disposed in first to third positions 701 to 703. The temperature sensors may be selectively disposed in the first to third positions 701 to 703. The temperature sensor 751 may be disposed in the first position 701 (i.e., in the central area inside a first coil), or the temperature sensor 753 may be disposed in the second position 702 (i.e., may be disposed to overlap the first coil 745 (formed on the PCB)). Further, the temperature sensor 755 may be disposed in the third position 703 (i.e., in an area between the first and second coils 745 and 746). In consideration of the mounting space of the temperature sensors, pattern-type temperature sensors, rather than chip-type temperature sensors, may be formed in the first to third positions.

The temperature sensors may be disposed to at least partially overlap the first coil that has the highest heating value, or may be disposed around the first coil. Since the first coil releases the greatest amount of heat in the antenna, the temperature sensors may be preferably disposed adjacent to the first coil. The temperature sensors disposed in the first to third positions, respectively, may be connected to the contact portion 743 by wire lines.

FIG. 8 illustrates a view of various patterns of temperature sensors according to various embodiments of the present disclosure.

Referring to FIG. 8, the temperature sensors, according to the various embodiments, may be formed in a pattern type on PCBs. The temperature sensors formed on the PCBs may be manufactured in various patterns. FIG. 8(a) illustrates a temperature sensor having a linear pattern. FIG. 8(b) illustrates a temperature sensor having a zigzag pattern. FIG. 8(c) illustrates a temperature sensor having a right-angled spiral pattern. FIG. 8(d) illustrates a temperature sensor having a loop pattern. The temperature sensors, according to an embodiment, may have various shapes according to the mounting positions thereof. In a case where a plurality of temperature sensors is mounted in an electronic device, different types of patterns may be mounted.

Figure 9:
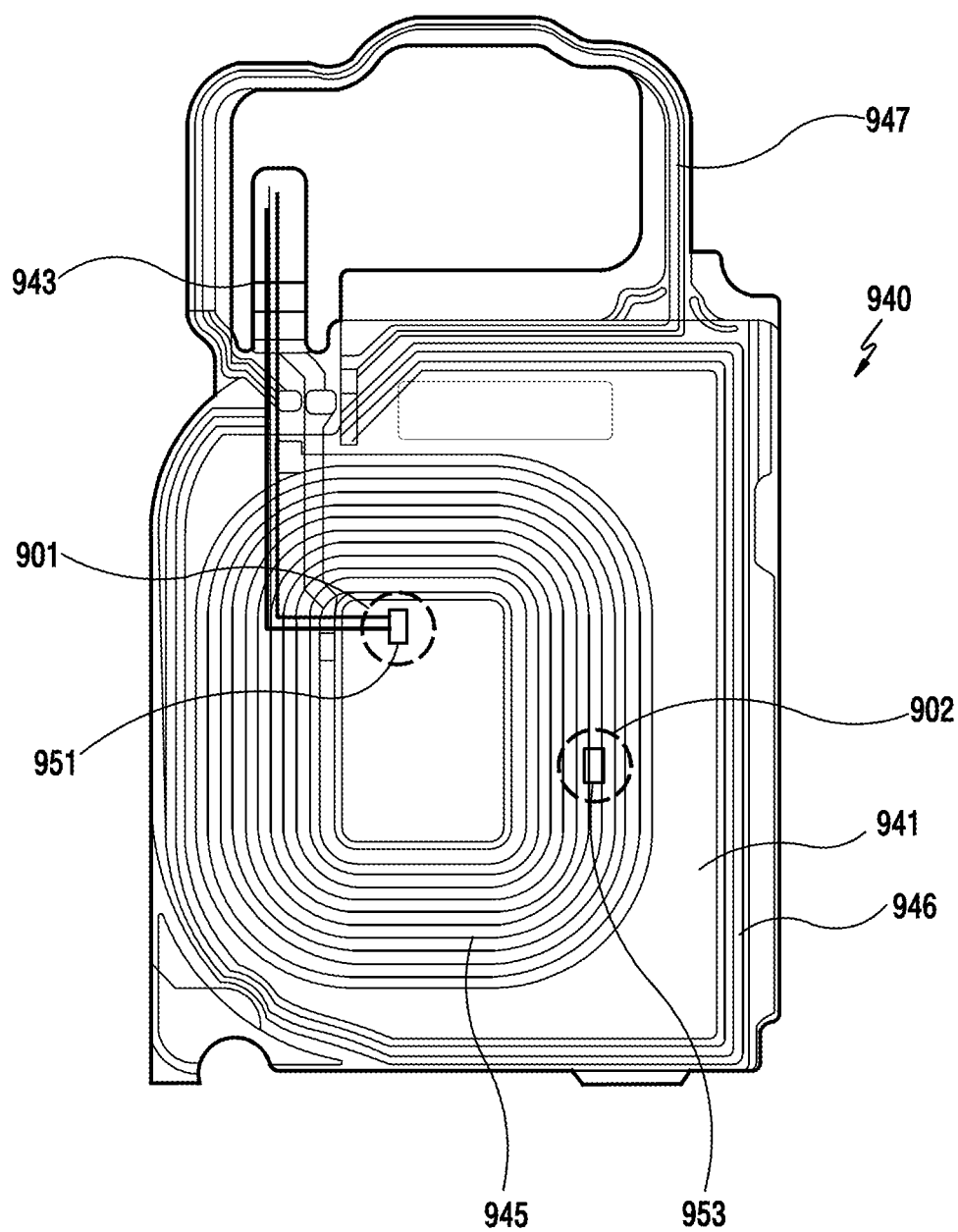
FIG. 9 illustrates a view of a state in which coils and temperature sensors of an antenna are arranged according to various embodiments of the present disclosure.

FIG. 9 illustrates a view of a state in which coils and temperature sensors of an antenna are arranged according to various embodiments of the present disclosure.

Referring to FIG. 9, in the arrangement of first to third coils 945, 946, and 947, the first coil 945 may be disposed in the substantially central area, the second coil 946 may be disposed to surround the first coil 945, and the third coil 947 may be disposed beside the first and second coils 945 and 946.

The antenna 940, according to the various embodiments, may have temperature sensors disposed thereon for identifying a heating value. The temperature sensors, according to various embodiments, may be disposed so as to not affect the RF performance of the first to third coils 945, 946, and 947. The sensors 951 and 953 illustrated in FIG. 9 may be chip-type temperature sensors. The temperature sensors 951 and 953 may be mounted on a PCB 941.

The temperature sensors, according to the various embodiments, may be disposed in first and second positions 901 and 902, respectively. The temperature sensor 951 disposed in the first location 901 or the temperature sensor 953 disposed in the second position 902 may be selectively disposed. Each of the temperature sensors may be disposed in the first position 901 (i.e., in the central area inside the first coil 945), or may be disposed in the second position 902 (i.e., may be formed to overlap the first coil 945 (formed on the PCB)). Without being limited thereto, however, the temperature sensors may be mounted in various positions so as to not degrade the RF performance of the first to third coils 945, 946, and 947.

The temperature sensors may be disposed to overlap the first coil that has the highest heating value, or may be disposed around the first coil. The temperature sensors 951 and 953 disposed in the first and second positions, respectively, may be connected to the contact portion by wire lines.

Figure 10:
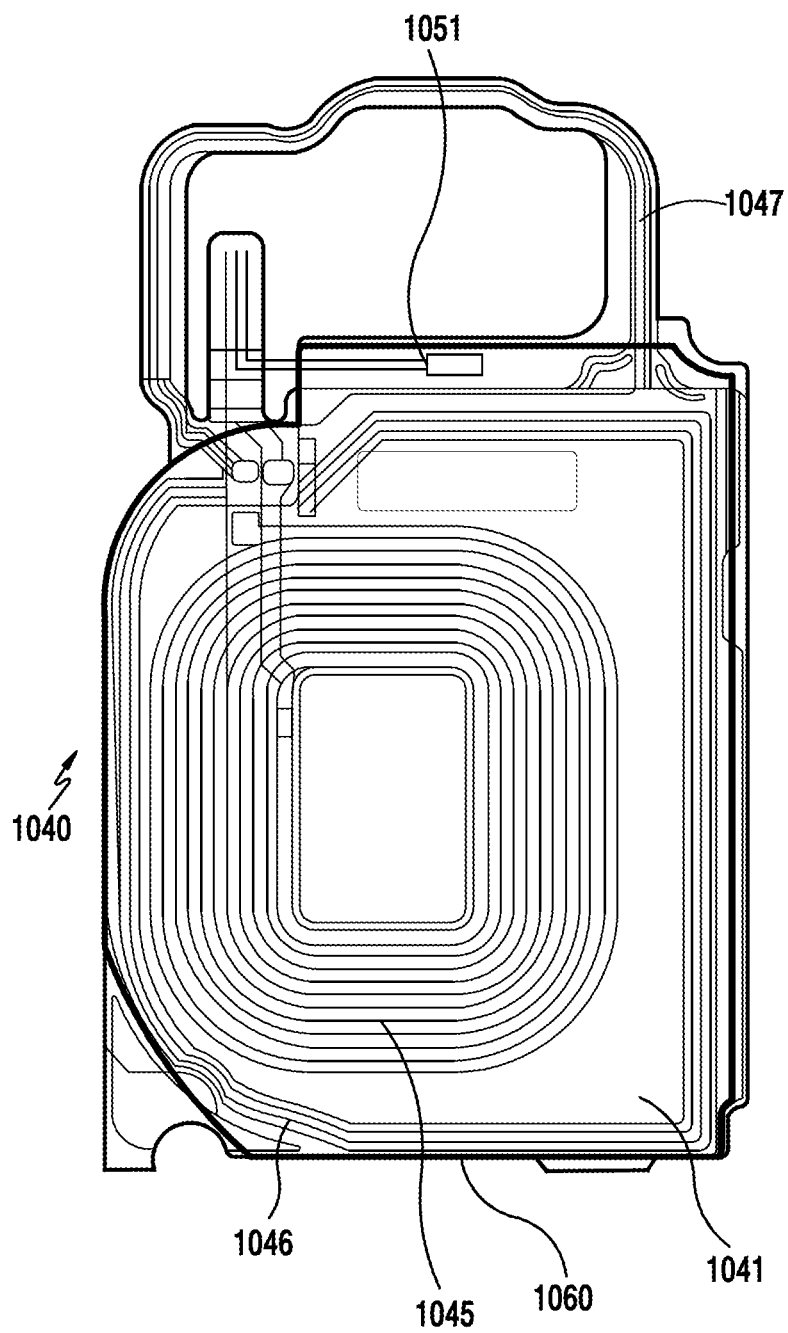
FIGS. 10 to 12 illustrate views of thermal spreading sheets that are attached to coils and a temperature sensor of an antenna according to various embodiments of the present disclosure.
Figure 11:
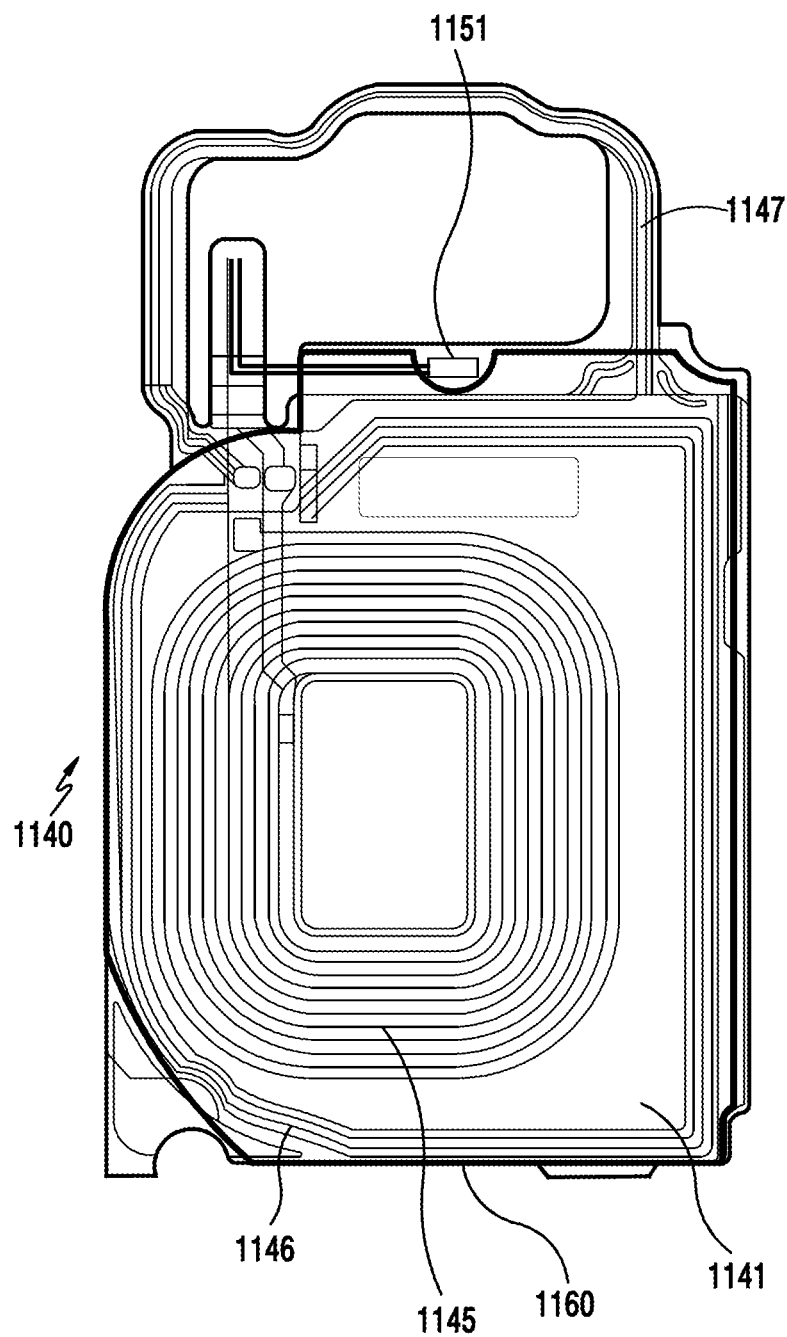
Figure 12:
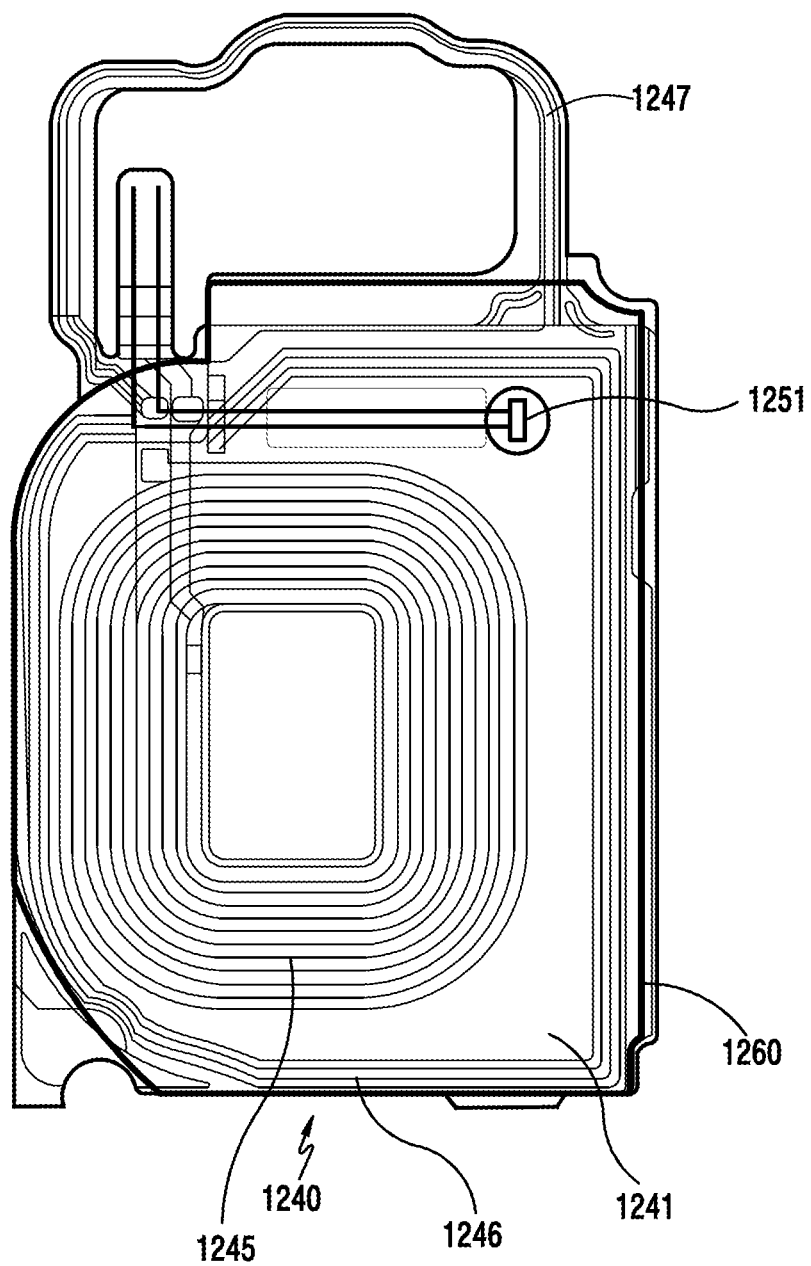

FIGS. 10 to 12 illustrate views of thermal spreading sheets that are attached to coils and a temperature sensor of an antenna according to various embodiments of the present disclosure.

Referring to FIG. 10, a thermal spreading sheet 1060 may be attached to an antenna 1040 according to various embodiments. The antenna 1040 may have first to third coils 1045, 1046, and 1047 disposed thereon. The thermal spreading sheet 1060 may be attached for surface heat dissipation of the first coil 1045 since the first coil 1045 has the highest heating value. In particular, the thermal spreading sheet 1060 spreads the heat released from the first coil 1045 to a temperature sensor 1051 so that the temperature sensor may accurately measure the temperature of the first coil. To this end, the thermal spreading sheet 1060 may be configured to cover the PCB 1041 on which the first and second coils 1045 and 1046 are mounted. The thermal spreading sheet 1060 may be formed of a metal sheet (such as a copper sheet, an aluminum sheet, etc.), a graphite sheet, etc. According to an embodiment, the temperature sensor 1051 may be disposed in a first position around the first and second coils 1045 and 1046, and the thermal spreading sheet 1060 may be attached to an area that includes the surrounding area of the first and second coils 1045 and 1046. The thermal spreading sheet 1060, according to the various embodiments, may be disposed to at least partially contact the printed circuit board.

Referring to FIG. 11, a thermal spreading sheet 1160 may be attached to an antenna 1140 according to various embodiments. The antenna 1140 may have first to third coils 1145, 1145, and 1047 disposed thereon. The thermal spreading sheet 1160 may be attached in order to reduce the surface heat dissipation of the first coil 1145 since the first coil 1145 has the highest heating value. In particular, the thermal spreading sheet 1160 spreads the heat released from the first coil 1145 to a temperature sensor 1151 so that the temperature sensor may accurately measure the temperature of the first coil. In a case where the temperature sensor 1151 is a chip-type temperature sensor, the thermal spreading sheet 1160 may be attached to the remaining area other than the temperature sensor 1151.

To this end, the thermal spreading sheet 1160 may be configured to cover the PCB 1141 on which the first and second coils 1145 and 1146 are mounted. The thermal spreading sheet 1160 may be formed of a metal sheet (such as a copper sheet, an aluminum sheet, etc.), a graphite sheet, etc. According to an embodiment, the temperature sensor 1151 may be disposed in a first position around the first and second coils 1145 and 1146, and the thermal spreading sheet 1160 may be attached to an area that includes the surrounding area of the first and second coils 1145 and 1146.

Referring to FIG. 12, a thermal spreading sheet 1260 may be attached to an antenna 1240 according to various embodiments. The antenna 1240 may have first to third coils 1245, 1246, and 1247 disposed thereon. The thermal spreading sheet 1260 may be attached for surface heat dissipation of the first coil 1245 since the first coil 1045 has the highest heating value. In particular, the thermal spreading sheet 1260 spreads the heat released from the first coil 1245 to a temperature sensor 1251 so that the temperature sensor may accurately measure the temperature of the first coil. To this end, the thermal spreading sheet 1260 may be configured to cover the PCB 1241 on which the first and second coils 1245 and 1246 are mounted. The temperature sensor 1251 may be disposed between the first and second coils 1245 and 1246, and the thermal spreading sheet 1260 may be attached to an area that includes the surrounding area of the first and second coils 1245 and 1246. In this case, if the temperature sensor 1251 is mounted in a chip type on the PCB 1241, the thermal spreading sheet 1260 may be attached to the remaining area other than the surrounding area of the temperature sensor 1251.

An electronic device, according to various embodiments of the present disclosure, may include: a printed circuit board (PCB); at least one wireless power supply coil mounted on the PCB; at least one temperature sensor disposed around the coil on the PCB; a battery pack disposed to face the coil; and a rear case in which the battery pack is accommodated, and the temperature sensor may be disposed around the coil.

According to various embodiments of the present disclosure, the rear case may have a rear cover coupled thereto, and the PCB on which the coil is mounted may be mounted on the inside of the rear cover.

According to various embodiments of the present disclosure, the rear case may have a first opening in which the battery pack is accommodated, and the temperature sensor may be disposed around the first opening.

According to various embodiments of the present disclosure, a first position may be an area around the coil and may be situated around the battery pack.

According to various embodiments of the present disclosure, the electronic device may further include a second opening in which the temperature sensor is accommodated and that is formed around the first opening.

According to various embodiments of the present disclosure, the temperature sensor may be accommodated in the second opening and may be disposed adjacent to a PCM of the battery pack to face the same.

According to various embodiments of the present disclosure, the second opening may be formed in a recess shape that is sufficient to accommodate the temperature sensor.

According to various embodiments of the present disclosure, the temperature sensor may be mounted in a chip type on the PCB, or may be formed in a pattern type.

According to various embodiments of the present disclosure, the temperature sensor may be formed in one pattern shape of a linear shape, a zigzag shape, a spiral shape, and a loop shape.

According to various embodiments of the present disclosure, a thermal spreading sheet and a heat shielding material may be attached to the temperature sensor.

According to various embodiments of the present disclosure, a thermal spreading sheet may be additionally attached to the remaining coil mounting area other than the temperature sensor when the temperature sensor is mounted in a chip type in a first position.

According to various embodiments of the present disclosure, a thermal spreading sheet may be additionally attached to the coil mounting area that contains the temperature sensor when the temperature sensor is mounted in a pattern type in a first position.

According to various embodiments of the present disclosure, the coil may include a wireless charging coil antenna, a wireless short-range communication coil antenna, and a secure transfer coil antenna, and the temperature sensor may be disposed around the wireless charging coil antenna.

An electronic device, according to various embodiments of the present disclosure, may include: a support structure; a display disposed on a first surface of the support structure; a first PCB disposed on a second surface opposite to the first surface of the support structure; a rear case coupled to the support structure; a battery pack accommodated in the rear case; a front cover disposed on the front of the display; a rear cover disposed on the back of the rear case; a second PCB mounted on the rear cover; a wireless charging antenna provided on the second PCB; and at least one temperature sensor disposed around the antenna of the second PCB.

According to various embodiments of the present disclosure, the front cover or the rear cover may be formed of a synthetic resin material, a metal material, a glass material, or a combination thereof, and may be flat or may have a curved edge.

According to various embodiments of the present disclosure, the temperature sensor may be accommodated in a first opening of the rear case so as to be adjacent to the battery pack accommodated therein.

According to various embodiments of the present disclosure, the temperature sensor may be formed around the first opening and may be accommodated in a second opening adjacent to the battery pack.

According to various embodiments of the present disclosure, the battery pack may be disposed parallel to the rear case without overlapping the same.

According to various embodiments of the present disclosure, the antenna may be disposed to overlap the battery pack while facing the same.

According to various embodiments of the present disclosure, the temperature sensor may be accommodated in a second opening to face a PCM of the battery pack.

An electronic device, according to various embodiments of the present disclosure, may include: a first plate directed in a first direction, a second plate directed in a second direction opposite to the first direction, and a side member configured to surround at least a part of the space between the first and second plates; a first printed circuit board (PCB) that is disposed between the first and second plates and includes at least one processor; a second printed circuit board (PCB) that is disposed between the first printed circuit board and the second plate and includes at least one antenna pattern; and a temperature sensor disposed to measure the temperature of at least a part of the second printed circuit board.

According to various embodiments of the present disclosure, at least a part of the temperature sensor may be disposed on the second printed circuit board or in the interior thereof.

According to various embodiments of the present disclosure, the second printed circuit board may include a flexible printed circuit board; the antenna pattern may include a first coil-type antenna pattern and a second coil-type antenna pattern configured to surround the first antenna pattern when viewed from above the second plate; and the temperature sensor may be disposed outside the second antenna pattern when viewed from above the second plate.

According to various embodiments of the present disclosure, the second printed circuit board may include a flexible printed circuit board; the antenna pattern may include a first coil-type antenna pattern and a second coil-type antenna pattern configured to surround the first antenna pattern when viewed from above the second plate; and the temperature sensor may be disposed within the area surrounded by the first antenna pattern when viewed from above the second plate.

According to various embodiments of the present disclosure, the second printed circuit board may include a flexible printed circuit board; the antenna pattern may include a first coil-type antenna pattern and a second coil-type antenna pattern configured to surround the first antenna pattern when viewed from above the second plate; and the temperature sensor may be disposed to at least partially overlap the first antenna pattern when viewed from above the second plate.

According to various embodiments of the present disclosure, the second printed circuit board may include a flexible printed circuit board; the antenna pattern may include at least one coil-type antenna pattern; and the temperature sensor may be disposed outside the antenna pattern when viewed from above the second plate.

According to various embodiments of the present disclosure, the electronic device may further include at least one of a wireless charging circuit, an NFC circuit, and a magnetic secure transfer circuit, and the at least one antenna pattern may be electrically connected to the at least one circuit.

According to various embodiments of the present disclosure, the electronic device may further include a thermal spreading sheet disposed between the first and second printed circuit boards, and the temperature sensor may be disposed to make contact with, or adjacent to, a part of the thermal spreading sheet.

According to various embodiments of the present disclosure, the thermal spreading sheet may be disposed to at least partially contact the second printed circuit board.

Hereinafter, a method for manufacturing a pattern-type temperature sensor on a substrate will be described with reference to the accompanying drawings. The temperature sensor on the substrate may be configured such that wires and coils are formed in different layers or in the same layer.

Figure 13A:
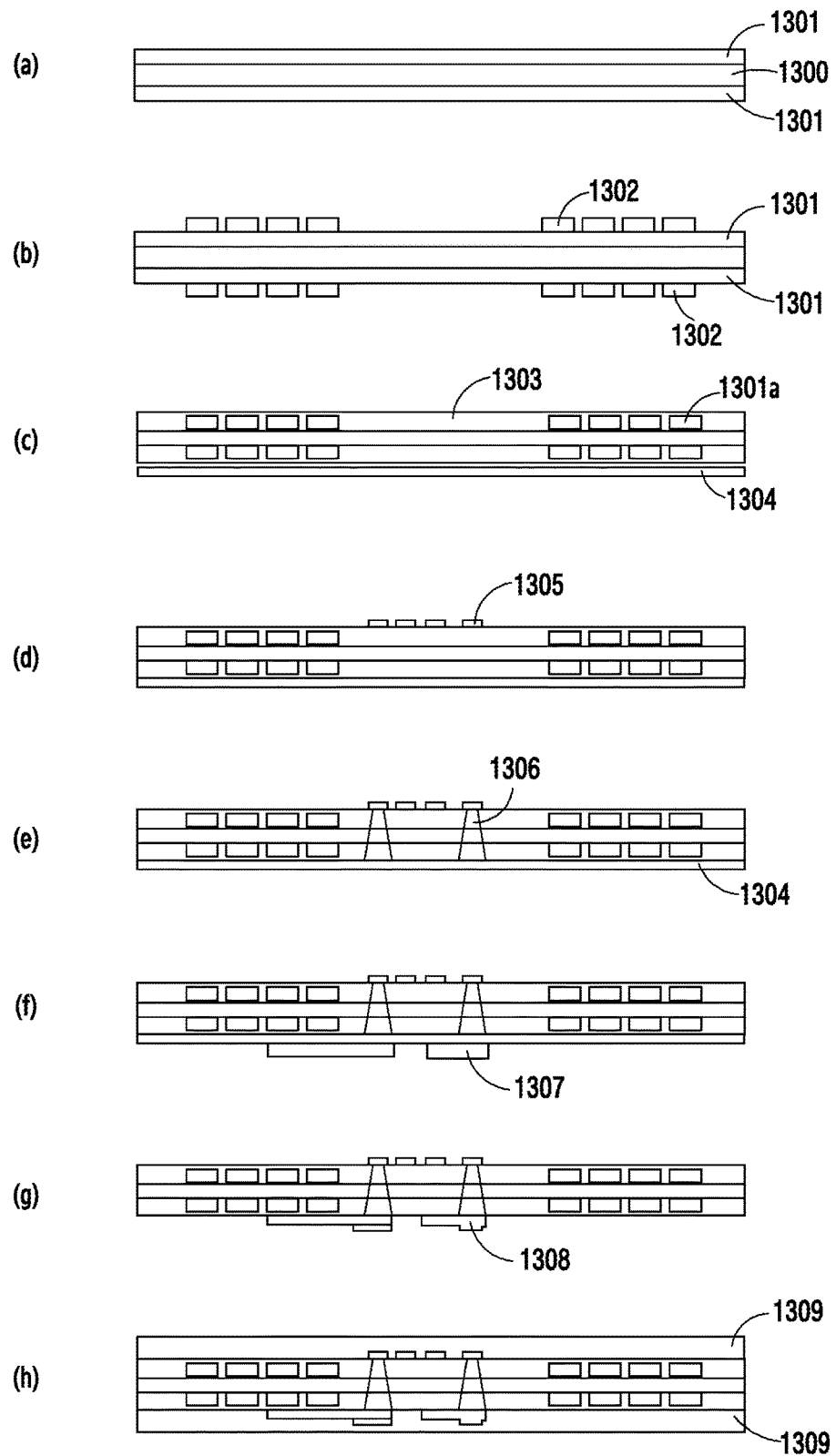
FIG. 13A illustrates a method for manufacturing a temperature sensor in which wires and coils are formed in different layers according to various embodiments of the present disclosure.
Figure 13B:
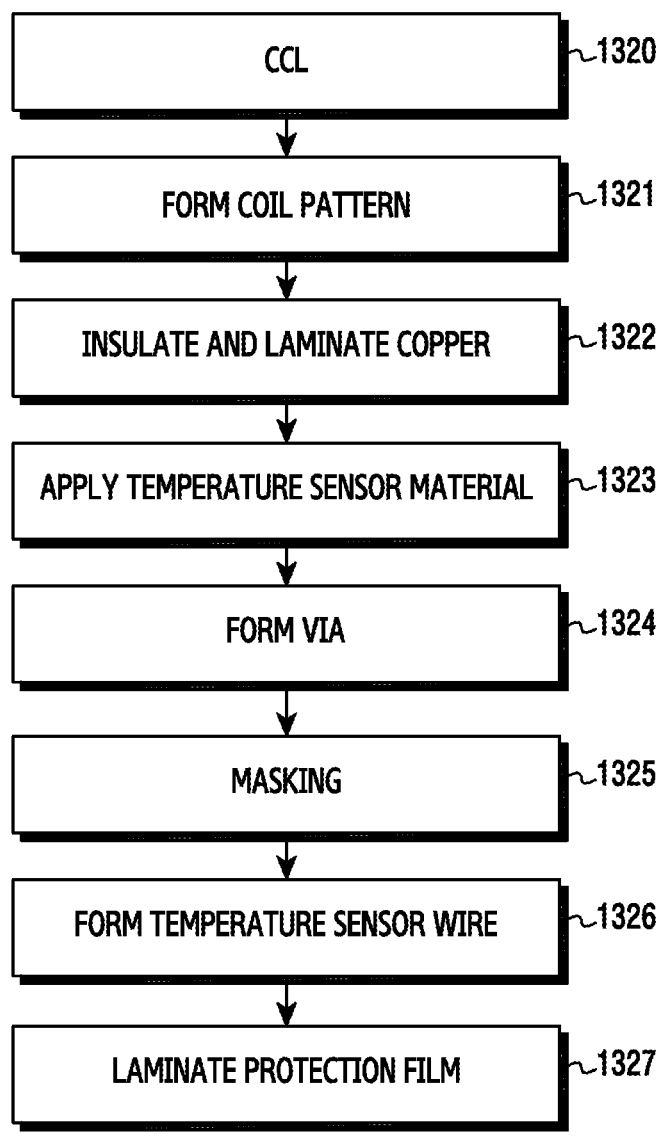
FIG. 13B illustrates a flowchart of a manufacturing method according to various embodiments of the present disclosure.

FIG. 13A illustrates a method for manufacturing a temperature sensor in which wires and coils are formed in different layers according to various embodiments of the present disclosure FIG. 13B illustrates a flowchart of a manufacturing method according to various embodiments of the present disclosure.

The method for manufacturing a temperature sensor in which wires and coils are formed in different layers, according to the various embodiments of the present disclosure, will be described with reference to FIGS. 13A and 13B.

Upper and lower copper layers 1301 may be formed on the top and bottom of a prepared substrate 1300 (operation 1320; copper clad laminate (CCL)).

Upper and lower coil patterns 1301*a* that constitute coils to be described below may be formed on the upper and lower copper layers 1301 using dry films 1032 (Operation 1321). The upper and lower coil patterns (FIG. 13 (c)) may be formed by attaching the dry films on the upper and lower copper layers and performing exposing/etching on the dry films.

Insulation layers 1303 may be formed in the respective coil patterns 1301*a*, and a copper layer 1304 for interconnection wiring may be formed on the lower coil pattern (Operation 1322).

A temperature sensor pattern 1305 may be formed by patterning the temperature sensor 1305 on the region of the insulation layer 1303 where the coil pattern 1302 is not disposed (Operation 1323).

The temperature sensor pattern 1305 and the copper layer 1304 for interconnection wiring may be connected to each other by forming vias 1306. The vias 1306 may be formed using a drill. The vias 1306 may be plated (Operation 1324).

A dry film 1307 may be applied to the copper layer 1304 after the vias 1306 are formed, and exposing/etching/masking operations may then be performed (Operation 1325).

Temperature sensor wires 1308 may be formed by removing the dry film 1307 (Operation 1326). The temperature sensor wires 1308 may be electrically connected to the vias.

Last, the temperature sensor pattern may be completely manufactured by laminating protection films 1309 on the temperature sensor pattern 1305 and the temperature sensor wire layer 1308, respectively.

Figure 14A:
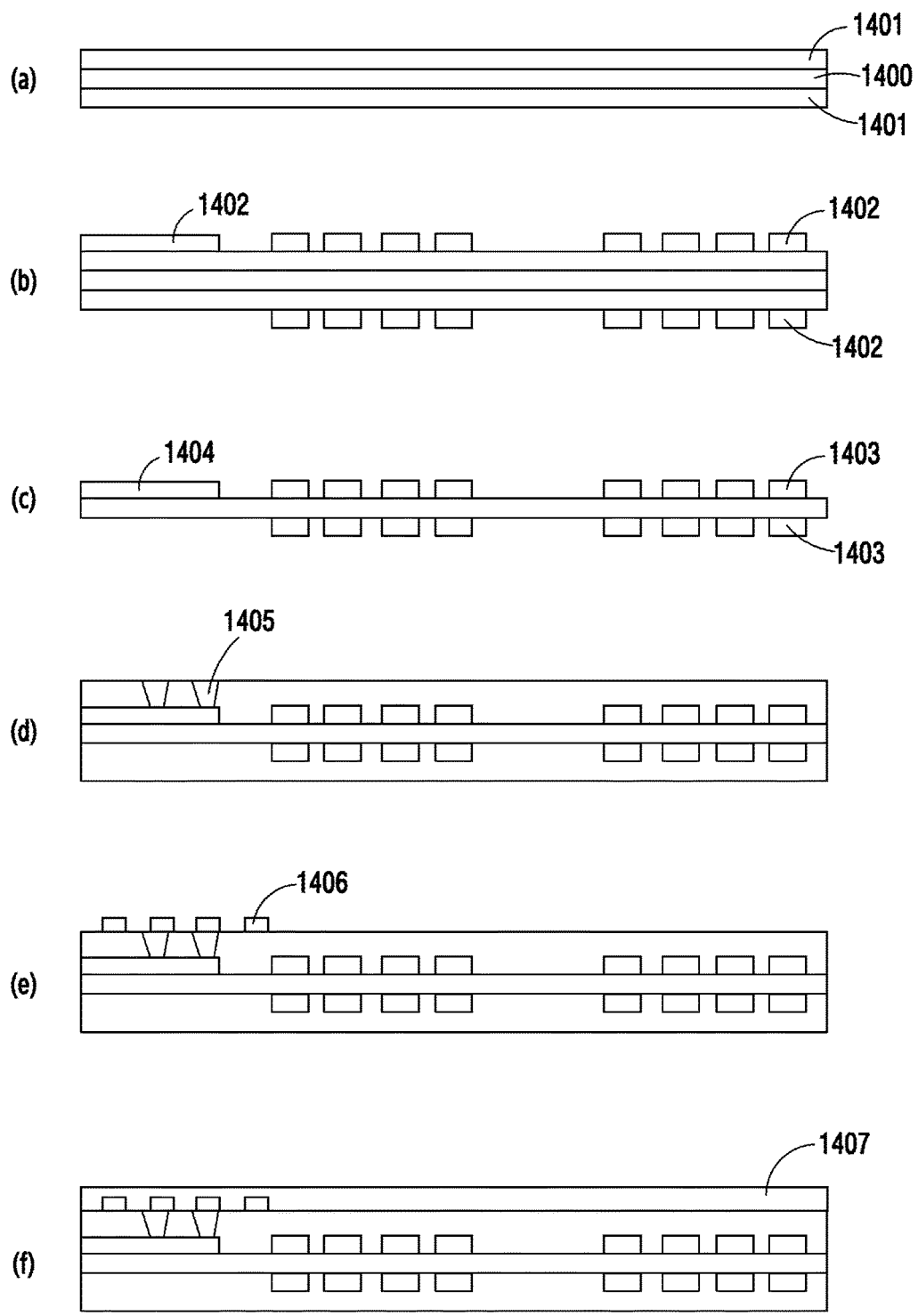
FIG. 14A illustrates a method for manufacturing a temperature sensor in which wires and coils are formed in the same layer according to various embodiments of the present disclosure.
Figure 14B:
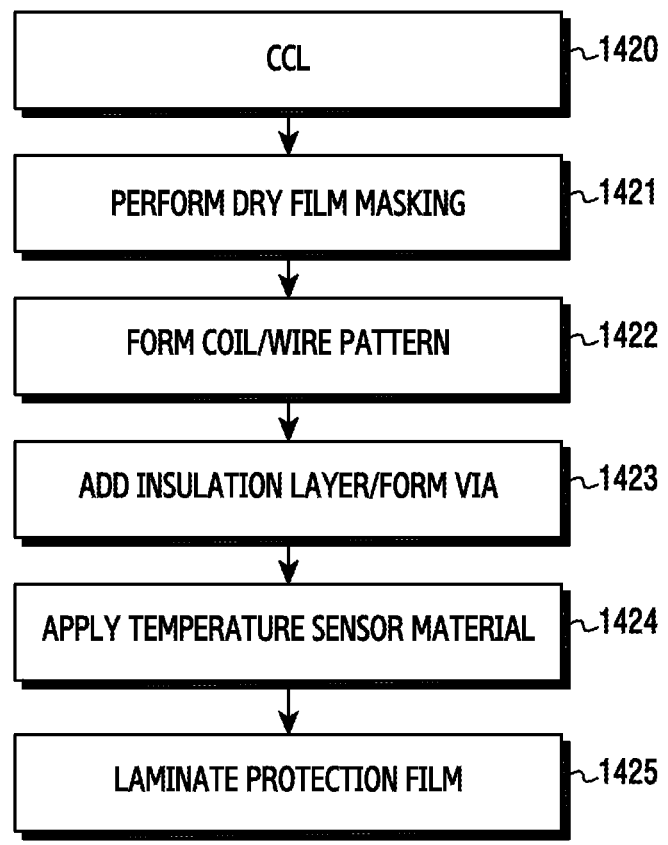
FIG. 14B illustrates a flowchart of a manufacturing method according to various embodiments of the present disclosure.

FIG. 14A illustrates a method for manufacturing a temperature sensor in which wires and coils are formed in the same layer according to various embodiments of the present disclosure, and FIG. 14B illustrates a flowchart of a manufacturing method according to various embodiments of the present disclosure.

The method for manufacturing a temperature sensor in which wires and coils are formed in the same layer, according to the various embodiments of the present disclosure, will be described with reference to FIGS. 14A and 14B.

Upper and lower copper layers 1401 may be formed on the top and bottom of a prepared substrate 1400 (operation 1420; copper clad laminate (CCL)).

Dry films 1402 may be applied to the upper and lower copper layers 1401, respectively, and an exposing process may then be performed (operation 1421; dry film masking).

The upper and lower copper layers 1401 may be subjected to etching after the exposing process, and the dry films may be removed (operation 1422). Coil patterns 1403 and a temperature sensor wire layer 1404 may be formed by this process.

The regions between the coil patterns 1403 or the regions between the coil patterns 1403 and the temperature sensor wire layer 1404 may be insulated, and vias 1405 may then be formed on the temperature sensor wire layer 1404. A temperature sensor pattern 1406 and the copper layer 1404 for interconnection wiring may be connected to each other by the vias 1405. The vias 1405 may be formed using a drill. The vias 1405 may be plated.

The temperature sensor pattern 1406 may be formed on the vias 1405 (Operation 1424).

Last, the temperature sensor pattern may be completely manufactured by laminating a protection film 1407 on the temperature sensor pattern 1406 (operation 1425).

In a case where the temperature sensor pattern, according to the various embodiments, is formed of a metal material, the temperature sensor pattern may be formed through dry film/exposing/etching, similar to a printed circuit board.

Figure 15:
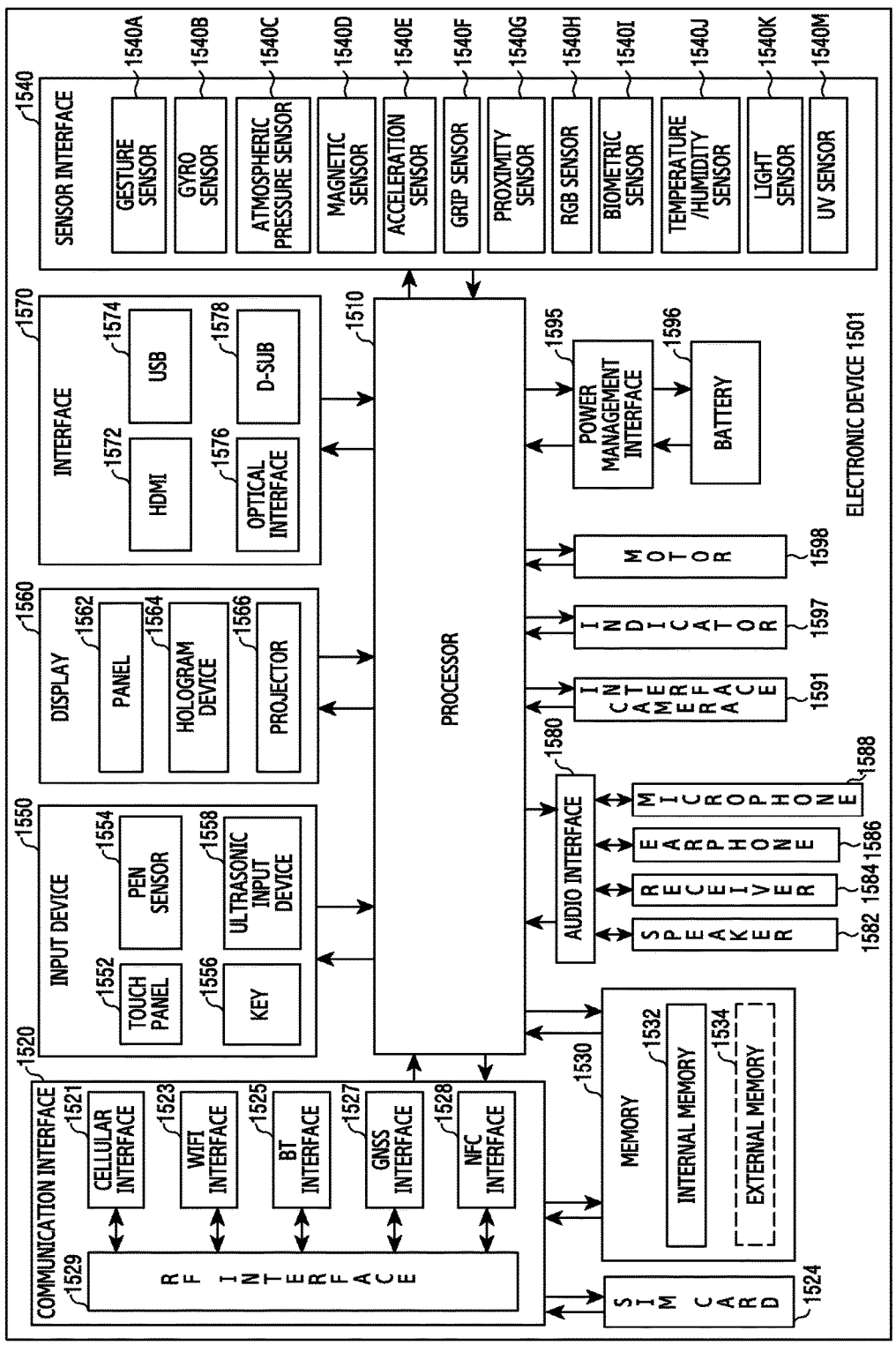
FIG. 15 illustrates a block diagram of an electronic device according to various embodiments of the present disclosure.

Meanwhile, in a case where the temperature sensor pattern, according to the various embodiments, is formed of a ceramic material, a sintering process is required after the temperature sensor pattern is printed. However, since the sintering process is performed at a high temperature, it may be possible to apply a temperature sensor pattern that is separately manufactured at the outside. FIG. 15 illustrates a block diagram of an electronic device according to the present disclosure.

Referring to FIG. 15, the electronic device 1501 includes an application processor (AP) 1510, a communication interface 1520, a subscriber identification module (SIM) card 1524, a memory 1530, a sensor 1540, an input device 1550, a display 1560, an interface 1570, an audio 1580, a camera 1591, a power management 1595, a battery 1596, an indicator 1597, and a motor 1598.

The AP 1510 runs an operating system or an application program to control a plurality of hardware or software constituent elements connected to the AP 1510, and may perform processing and operation of various data including multimedia data. The AP 1510 may be, for example, implemented as a system on chip (SoC). According to an embodiment of the present disclosure, the AP 1510 further includes a graphical processing unit (GPU). The AP 1510 further includes at least one of other constitute elements (e.g., the cellular interface 1521). The AP 1510 loads an instruction or data, which is received from a non-volatile memory connected to each or at least one of other constituent elements, to a volatile memory and processes the loaded instruction or data. In addition, the AP 1510 stores in the non-volatile memory, data received from at least one of the other constituent elements or generated by at least one of the other constituent elements.

The communication interface 1520 performs data transmission/reception in communication between the electronic device 1501 and other electronic devices connected through a network. According to an embodiment of the present disclosure, the communication interface 1520 includes cellular interface 1521, a Wi-Fi interface 1523, a BT interface 1525, a GPS interface 1527, an NFC interface 1528, and a radio frequency (RF) interface 1529.

The cellular interface 1521 provides voice telephony, a video telephony, a text service, an Internet service, and the like, through a telecommunication network (e.g., LTE, LTE-A, CDMA, WCDMA, UNITS, WiBro, GSM, and the like). In addition, the cellular interface 221 may, for example, use a SIM card 1524 to perform electronic device distinction and authorization within the telecommunication network. According to an embodiment of the present disclosure, the cellular interface 1521 may perform at least some of functions that the AP 1510 may provide. For example, the cellular interface 1521 performs at least one part of a multimedia control function.

The WiFi interface 223, the BT interface 1525, the GPS interface 1527 and the NFC interface 1528 each may include, for example, a processor for processing data transmitted/received through the corresponding interface. According to an embodiment of the present disclosure, at least some (e.g., two or more) of the cellular interface 1521, the WiFi interface 1523, the BT interface 1525, the GPS interface 1527 and the NFC interface 1528 are included within one IC or IC package.

The RF interface 1529 performs transmission/reception of data, for example, transmission/reception of an RF signal. The RF interface 1529 may include, for example, a transceiver, a power amplifier module (PAM), a frequency filter, a low noise amplifier (LNA), an antenna and the like. According to an embodiment of the present disclosure, at least one of the cellular interface 1521, the WiFi interface 1523, the BT interface 1525, the GPS interface 1527 or the NFC interface 1528 may perform transmission/reception of an RF signal through a separate RF interface.

The SIM card 1524 includes a SIM, and may be inserted into a slot provided in a specific position of the electronic device 1501. The SIM card 1524 includes unique identification information (e.g., an integrated circuit card ID (IC-CID)) or subscriber information (e.g., an international mobile subscriber identity (IMSI)).

The memory 230 includes an internal memory 1532 or an external memory 234. The internal memory 1532 includes, for example, at least one of a volatile memory (e.g., a dynamic random access memory (DRAM), a static RAM (SRAM) and a synchronous DRAM (SDRAM)) or a non-volatile memory (e.g., a one-time programmable read only memory (OTPROM), a programmable ROM (PROM), an erasable and programmable ROM (EPROM), an electrically erasable and programmable ROM (EEPROM), a mask ROM, a flash ROM, a not and (NAND) flash memory, and a not or (NOR) flash memory).

According to an embodiment of the present disclosure, the internal memory 1532 may be a solid state drive (SSD). The external memory 1534 may further include a flash drive, for example, compact flash (CF), secure digital (SD), micro-SD, mini-SD, extreme digital (xD), a memory stick, and the like. The external memory 1534 may be operatively connected with the electronic device 1501 through various interfaces.

The sensor 1540 measures a physical quantity or detects an activation state of the electronic device 101, and converts measured or detected information into an electric signal. The sensor module 1540 includes, for example, at least one of a gesture sensor 1540A, a gyro sensor 1540B, an air pressure sensor 1540C, a magnetic sensor 1540D, an acceleration sensor 1540E, a grip sensor 1540F, a proximity sensor 1540G, a color sensor 1540H (e.g., a red, green, blue (RGB) sensor), a bio-physical sensor 1540I, a temperature/humidity sensor 1540J, an illumination sensor 1540K, a ultraviolet (UV) sensor 1540M, and the like. Additionally or alternatively, the sensor 1540 may also include, for example, an E-nose sensor, an electromyography (EMG) sensor, an electroencephalogram (EEG) sensor, an electrocardiogram (ECG) sensor, an infrared (IR) sensor, an iris sensor, a fingerprint sensor, and the like. The sensor 1540 may further include a control circuit for controlling at least one or more sensors belonging therein.

The input device 1550 includes a touch panel 1552, a (digital) pen sensor 1554, a key 1556, an ultrasonic input device 1558, and the like. The touch panel 1552 may, for example, detect a touch input in at least one of a capacitive overlay scheme, a pressure sensitive scheme, an infrared beam scheme, and an acoustic wave scheme. The touch panel 1552 may also include a control circuit. In a case of the capacitive overlay scheme, physical contact or proximity detection is possible. The touch panel 1552 may further include a tactile layer, to provide a tactile response to a user.

The (digital) pen sensor 1554 may be implemented in the same or similar method to receiving a user's touch input or by using a separate sheet for detection. The key 1556 may include, for example, a physical button, an optical key, or a keypad. The ultrasonic input device 1558 is capable of identifying data by detecting a sound wave in the electronic device 1501 through an input tool generating an ultrasonic signal, and enables wireless detection. According to an embodiment of the present disclosure, the electronic device 1501 may also use the communication interface 1520 to receive a user input from a connected external device (e.g., a computer or a server).

The display 1560 (e.g., the display 160) includes a panel 1562, a hologram device 1564, or a projector 1566. The panel 1562 may be, for example, an LCD, an active-matrix organic LED (AMOLED), and the like. The panel 1562 may be, for example, implemented to be flexible, transparent, or wearable. The panel 1562 may be constructed as one module along with the touch panel 1552 as well. The hologram device 1564 may use interference of light to show a three-dimensional image in the air. The projector 1566 may project light to a screen to display an image. The screen may be, for example, located inside or outside the electronic device 1501. According to an embodiment of the present disclosure, the display 1560 may further include a control circuit for controlling the panel 1562, the hologram device 1564, or the projector 1566.

The interface 1570 includes, for example, a high-definition multimedia interface (HDMI) 1572, a universal service bus (USB) 1574, an optical interface 1576, or a D-subminiature (D-sub) 1578. Additionally or alternatively, the interface 1570 includes, for example, a mobile high-definition link (MHL) interface, an SD card/multimedia card (MMC) interface or an infrared data association (IrDA) standard interface.

The audio 1580 converts a voice and an electric signal interactively. The audio 1580 may, for example, process sound information which is inputted or outputted through a speaker 1582, a receiver 1584, an earphone 1586, the microphone 1588, and the like.

The camera 1591 takes still pictures and moving pictures. According to an embodiment of the present disclosure, the camera 1591 includes one or more image sensors (e.g., a front sensor or a rear sensor), a lens, an image signal processor (ISP), or a flash (e.g., an LED or a xenon lamp).

The power management 1595 manages electric power of the electronic device 1501. The power management 1595 includes, for example, a power management integrated circuit (PMIC), a charger IC, a battery, a battery gauge, and the like.

The PMIC may be, for example, mounted within an integrated circuit or an SoC semiconductor. A charging scheme may be divided into a wired charging scheme and a wireless charging scheme. The charger IC charges the battery 1596, and prevents the inflow of overvoltage or overcurrent from an electric charger. According to an embodiment of the present disclosure, the charger IC includes a charger IC for at least one of the wired charging scheme or the wireless charging scheme. The wireless charging scheme may, for example, be a magnetic resonance scheme, a magnetic induction scheme, an electromagnetic wave scheme, and the like. A supplementary circuit for wireless charging, for example, a circuit, such as a coil loop, a resonance circuit, a rectifier, and the like, may be added.

The battery gauge may, for example, measure a level of the battery 1596, a voltage during charging, a current or a temperature. The battery 1596 generates or stores electricity, and uses the stored or generated electricity to supply power to the electronic device 1501. The battery 1596 may include, for example, a rechargeable battery or a solar battery.

The indicator 1597 displays a specific status of the electronic device 1501 or one part (e.g., the AP 1510) thereof, for example a booting state, a message state, a charging state, and the like. The motor 1598 may convert an electric signal into a mechanical vibration. The electronic device 101 may include a processing device (e.g., a GPU) for mobile TV support. The processing device for mobile TV support may, for example, process media data according to the standards of digital multimedia broadcasting (DMB), digital video broadcasting (DVB), a media flow, and the like.

Each of the above-described elements of the electronic device may include one or more components, and the name of a corresponding element may vary according to the type of electronic device. The electronic device according to the present disclosure may include at least one of the above-described elements and may exclude some of the elements or further include other additional elements. Further, some of the elements of the electronic device according to the present disclosure may be coupled to form a single entity while performing the same functions as those of the corresponding elements before the coupling.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. An electronic device comprising:
   a printed circuit board (PCB);
   at least one wireless power supply coil mounted on the PCB;
   at least one temperature sensor disposed on the PCB;
   a battery pack disposed to face the at least one wireless power supply coil;
   a rear case in which the battery pack is accommodated, wherein:
   the at least one temperature sensor is disposed around the at least one wireless power supply coil;
   the rear case includes a first opening in which the battery pack is accommodated; and
   the at least one temperature sensor is disposed around the first opening; and
   a second opening in which the at least one temperature sensor is accommodated and formed around the first opening.

2. The electronic device of claim 1, wherein the rear case includes a rear cover coupled to the rear case, and wherein the PCB on which the at least one wireless power supply coil is mounted on an inside of the rear cover.

3. The electronic device of claim 1, wherein the at least one temperature sensor is accommodated in the second opening and disposed adjacent to a protection circuit module (PCM) of the battery pack to face the PCM of the battery pack, wherein the second opening is formed in a recess shape that is sufficient to accommodate the at least one temperature sensor.

4. The electronic device of claim 1, wherein a thermal spreading sheet and a heat shielding material are attached to the at least one temperature sensor.

5. The electronic device of claim 4, wherein the thermal spreading sheet is additionally attached to a remaining coil mounting area other than the at least one temperature sensor when the at least one temperature sensor is mounted in a chip type in a first position.

6. The electronic device of claim 5, wherein the thermal spreading sheet is additionally attached to a remaining coil mounting area that contains the at least one temperature sensor when the at least one temperature sensor is mounted in a pattern type in a first position.

7. The electronic device of claim 1, wherein the at least one wireless power supply coil comprises a wireless charging coil antenna, a wireless short-range communication coil antenna, and a secure transfer coil antenna, and wherein the at least one temperature sensor is disposed around the wireless charging coil antenna.

8. An electronic device comprising:
a support structure;
a display disposed on a first surface of the support structure;
a first PCB disposed on a second surface opposite to the first surface of the support structure;
a rear case coupled to the support structure;
a battery pack accommodated in the rear case;
a front cover disposed on a front of the display;
a rear cover disposed on a back of the rear case;
a second PCB mounted on the rear cover;
at least one wireless charging coil provided on the second PCB; and
at least one temperature sensor disposed around the at least one wireless charging coil, wherein:
the at least one temperature sensor is accommodated in a first opening of the rear case so as to be adjacent to the battery pack accommodated in the first opening of the rear case; and
the at least one temperature sensor is formed around the first opening and accommodated in a second opening adjacent to the battery pack.

9. The electronic device of claim 8, wherein the front cover or the rear cover is formed of at least one of a synthetic resin material, a metal material, or a glass material, and is flat or includes a curved edge.

10. The electronic device of claim 8, wherein the battery pack is disposed parallel to the rear case without overlapping with the rear case, and wherein the at least one wireless charging coil is disposed to overlap the battery pack while facing the battery pack.

11. An electronic device comprising:
a first plate directed in a first direction, a second plate directed in a second direction opposite to the first direction, and a side member configured to surround at least a part of a space between the first and second plates;
a first printed circuit board (PCB) disposed between the first and second plates and comprises at least one processor;
a second PCB disposed between the first PCB and the second plate and comprises at least one antenna pattern; and
a temperature sensor configured to measure a temperature of at least a part of the second PCB.

12. The electronic device of claim 11, wherein at least a part of the temperature sensor is disposed on the second PCB or in an interior of the second PCB.

13. The electronic device of claim 11, wherein the second PCB comprises:
a flexible printed circuit board (FPCB);
the at least one antenna pattern comprising a first coil-type antenna pattern and a second coil-type antenna pattern configured to surround the first coil-type antenna pattern when viewed from above the second plate; and
the temperature sensor disposed outside the second coil-type antenna pattern when viewed from above the second plate.

14. The electronic device of claim 11, wherein the second PCB comprises:
an FPCB;
the at least one antenna pattern comprising a first coil-type antenna pattern and a second coil-type antenna pattern configured to surround the first coil-type antenna pattern when viewed from above the second plate; and
the temperature sensor disposed within an area surrounded by the first coil-type antenna pattern when viewed from above the second plate.

15. The electronic device of claim 11, wherein the second PCB comprises:
an FPCB;
the at least one antenna pattern comprising a first coil-type antenna pattern and a second coil-type antenna pattern configured to surround the first coil-type antenna pattern when viewed from above the second plate; and
the temperature sensor disposed to at least partially overlap the first coil-type antenna pattern when viewed from above the second plate.

16. The electronic device of claim 11, wherein the second PCB comprises:
an FPCB;
the at least one antenna pattern comprising at least one coil-type antenna pattern; and
the temperature sensor disposed outside the at least one antenna pattern when viewed from above the second plate.

17. The electronic device of claim 11, further comprising a thermal spreading sheet disposed between the first and second PCBs, wherein the temperature sensor is disposed to make contact with, or adjacent to, a part of the thermal spreading sheet, and
wherein the thermal spreading sheet is disposed to at least partially contact the second PCB.

* * * * *